United States Patent
Takahashi et al.

(10) Patent No.: US 6,404,371 B2
(45) Date of Patent: Jun. 11, 2002

(54) WAVEFORM GENERATOR AND TESTING DEVICE

(75) Inventors: Takeshi Takahashi; Yasuo Furukawa; Masayuki Kawabata, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/801,787

(22) Filed: Mar. 9, 2001

Related U.S. Application Data

(63) Continuation of application No. PCT/JP00/04628, filed on Jul. 11, 2000.

(30) Foreign Application Priority Data

Jul. 12, 1999 (JP) .............................. 11-198175

(51) Int. Cl.[7] .................................................. H03M 1/66
(52) U.S. Cl. ...................................................... 341/148
(58) Field of Search ................................. 341/147, 144; 388/915

(56) References Cited

U.S. PATENT DOCUMENTS 4,061,909 A * 12/1977 Bryant ........................ 341/147
5,714,954 A * 2/1998 Chung ........................ 341/147

FOREIGN PATENT DOCUMENTS

| JP | 63-144269 | 6/1988 |
| JP | 4-14901 | 1/1992 |
| JP | 4-47767 | 4/1992 |
| JP | 4-189003 | 7/1992 |
| JP | 4-102080 | 9/1992 |
| JP | 4-115082 | 10/1992 |
| JP | 4-286207 | 10/1992 |
| JP | 4-302312 | 10/1992 |
| JP | 4-330827 | 11/1992 |
| JP | 5-240919 | 9/1993 |
| JP | 5-327510 | 12/1993 |

* cited by examiner

*Primary Examiner*—Brian Young
(74) *Attorney, Agent, or Firm*—Rosenthal & Osha L.L.P.

(57) ABSTRACT

A waveform generator 30 for generating a desired waveform includes a plurality of rectangular wave generators (40a to 40n) for generating a plurality of rectangular waves and a waveform synthesizing unit 42 for synthesizing the rectangular waves to generate a multi-level synthesized wave, and generate the desired wave based on the synthesized wave.

30 Claims, 18 Drawing Sheets

(a) 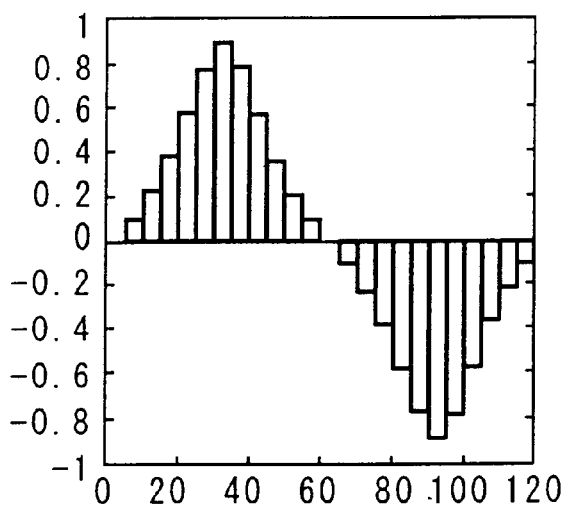
(b) 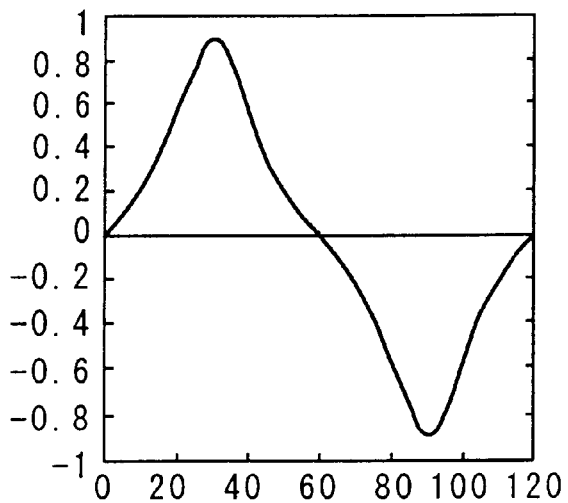
FIG. 2

(a)
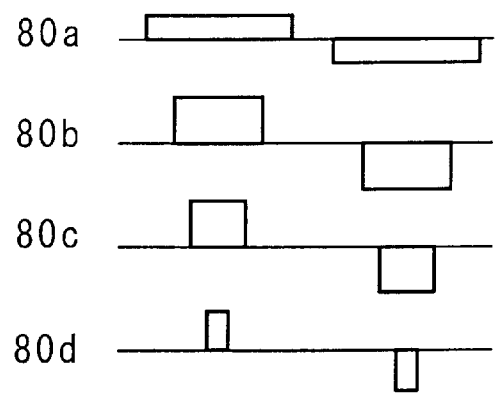
(b)
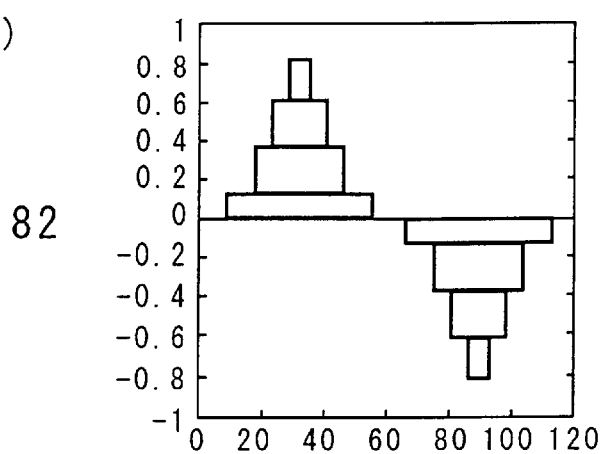
(c)
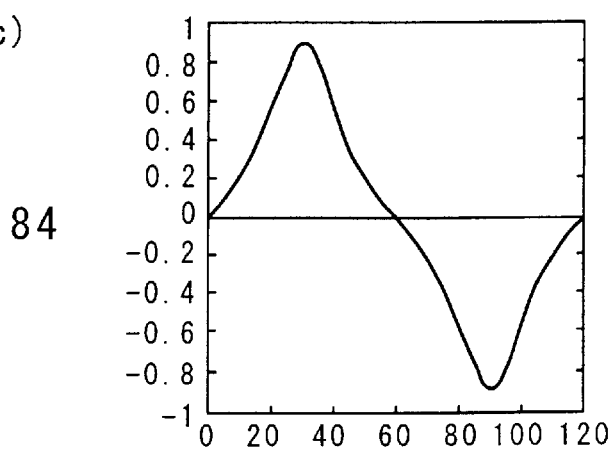
FIG. 6

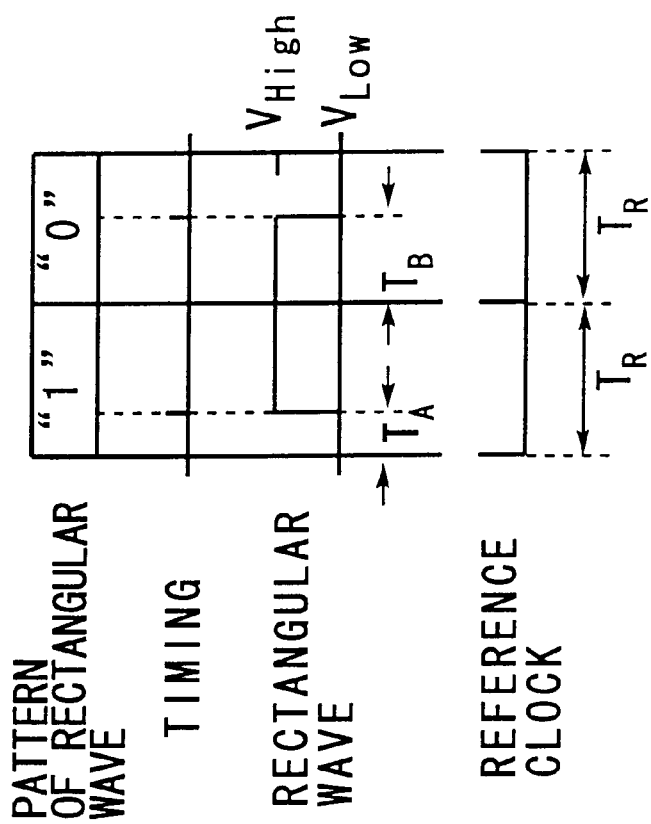
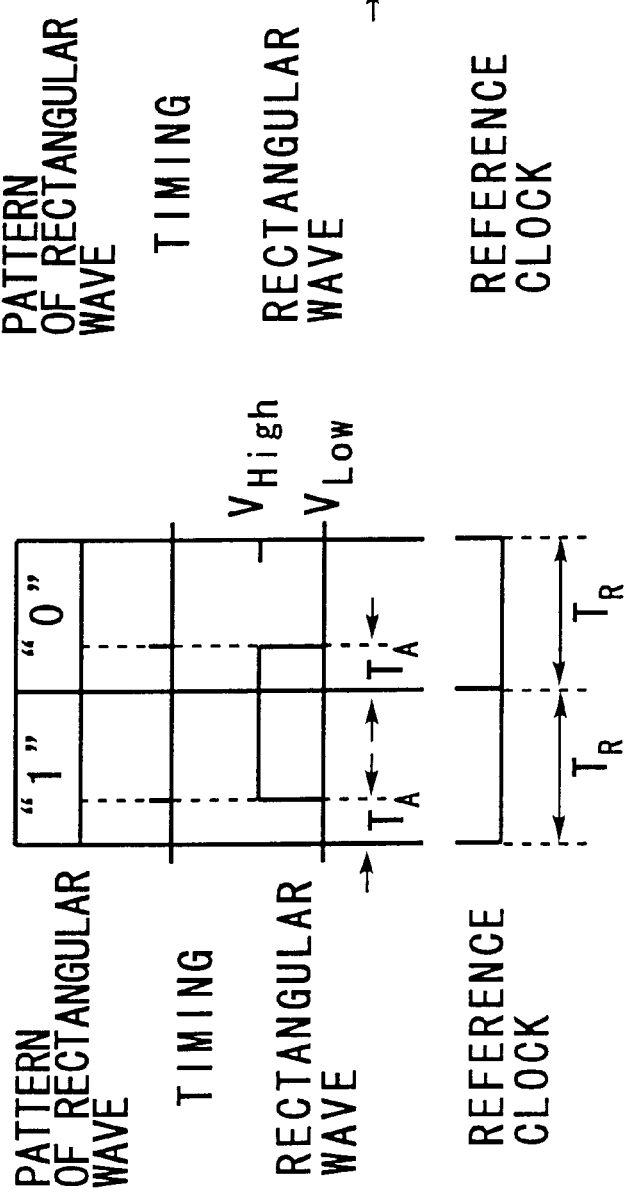
FIG. 10

WAVEFORM GENERATOR AND TESTING DEVICE

This is a continuation application of PCT/JP00/04628 filed on Jul. 11, 2000, further of a Japanese patent application, H11-198175 filed on Jul. 12, 1999, the contents of which are incorporated herein by reference.

BACKGROUND OF THE INVENTION

1. Field of the Invention

The present invention relates to a waveform generator that can generate a desired waveform and a testing device including the waveform generator.

2. Description of the Related Art

A testing device for testing electric devices each having an A-D converting unit that can convert an analog signal to a digital signal includes a waveform generator that generates a testing waveform to be used for testing the A-D converting unit of the electric device.

FIG. 1 is a block diagram showing a conventional waveform generator 10. The waveform generator 10 includes a waveform memory 20, a reference clock generator 22, a D-A converting unit 24 and a waveform outputting unit 26. The waveform memory 20 stores testing waveform data to be used for generating a testing waveform. The waveform memory 20 outputs the testing waveform data to the D-A converting unit 24 at a time of a reference clock supplied from the reference clock generator. The D-A converting unit 24 converts the testing waveform data into a voltage value at the time of the reference clock. The waveform outputting unit 26 outputs the testing waveform obtained by removing a predetermined frequency component from the voltage value supplied from the D-A converting unit 24 at the time of the reference clock.

FIG. 2(a) shows the voltage value output from the D-A converting unit 24 included in the waveform generator 10 shown in FIG. 1. The D-A converting unit 24 converts the testing waveform data supplied from the waveform memory 20 into the voltage value and outputs the obtained voltage value at the time of the reference clock. Thus, the D-A converting unit 24 outputs the voltage value that changes at a period of the reference clock.

FIG. 2(b) shows the testing waveform output from the waveform outputting unit 26 included in the waveform generator 10 described referring to FIG. 1. The waveform outputting unit 26 outputs the testing waveform after removing the predetermined frequency component from the waveform shown in FIG. 2(a).

In a case of generating a testing waveform having a high frequency, it was necessary for the conventional waveform generator 10 to include the D-A converting unit 24 that can operate at high speed. Also, in the conventional waveform generator 10, it was difficult to approximate the testing waveform with high accuracy because the conventional waveform generator 10 generates voltage values approximating the voltage values of the testing waveform at constant intervals.

SUMMARY OF THE INVENTION

Therefore, it is an object of the present invention to provide a waveform generator and a testing device which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a waveform generator for generating a desired waveform comprises: a rectangular wave generating unit operable to generate a plurality of rectangular waves; and a waveform synthesizing unit operable to synthesize the rectangular waves to generate a multi-level synthesized wave, wherein the desired waveform is generated based on the synthesized wave.

The rectangular wave generating unit may generate the rectangular waves in such a manner that each of the rectangular waves rises at a desired rising timing based on the desired waveform and falls at a desired falling timing based on the desired waveform. In addition, the waveform generator may further comprise a filter operable to remove a predetermined frequency component from the synthesized wave.

The rectangular wave generating unit may include a waveform memory operable to store information regarding a voltage value of each of the rectangular waves. The rectangular wave generating unit may further include: a timing memory operable to store the rising and falling timings of each of the rectangular waves; and a rectangular wave outputting unit operable to output the rectangular waves based on the information and the rising and falling timings of each of the rectangular waves.

The rectangular wave generating unit may include: a plurality of waveform memories each operable to store information of a voltage value of a corresponding one of the rectangular waves; a plurality of timing memories each operable to store the rising and falling timing of a corresponding one of the rectangular waves; and a rectangular wave outputting unit operable to output the rectangular waves based on the information of each of the rectangular waves and the rising and falling timings of each rectangular wave.

The rectangular wave outputting unit may be a D-A converter that converts the information of the voltage value into an analog signal. The waveform generator may further comprise a timing adjuster operable to delay a reference clock based on the rising and falling timings of each of the rectangular waves stored in the timing memory (memories).

The waveform generator may further comprise a voltage controller operable to control the amplitude of each of the rectangular waves based on the desired waveform. The waveform synthesizing unit may perform an operation for the voltage value of each of the rectangular waves.

The rectangular wave generating unit may convert the information of the voltage value stored in the waveform memory into an N-digit base-M number (N and M are integers equal to or larger than 2), generate Nth number of logical voltage values that are voltage values specifying logical values corresponding to the N-digit base-M number, and supply the logical voltage values to the waveform synthesizing unit. Moreover, the rectangular wave generating unit may include Nth number of rectangular wave generators operable to generate the M-valued logical voltage values, respectively, and the waveform synthesizing unit obtains $(1/M)^K$ times the logical voltage value supplied from the K-th waveform generator (K is an integer equal to or larger than 1 but does not exceed N) and synthesizes $(1/M)^K$ times the logical voltage values so as to generate the desired waveform.

The waveform synthesizing unit may include a ladder having the Nth number of logical voltage values as inputs. In this case, the Nth number of rectangular wave generators are electrically connected to Nth number of nodes, respectively, the nodes are connected to each other via resistors each having a predetermined resistance, the K-th logical voltage value to (1/M) times at the K-th node, and a voltage value at the K-th node drops to (1/M) times at the (K−1)th node.

The waveform synthesizing unit may include a ladder having the Nth number of logical voltage value as inputs. In this case, the J-th rectangular wave generator (J is an integer equal to or larger than 1 but does not exceed (N−1)) is connected to (N−1) nodes; the nodes are connected to each other via resistors each having a predetermined resistance; the N-th rectangular wave generator is connected to the (N−1)th node; the N-th logical voltage value falls to (1/M) times the N-th logical voltage value at the (N−1) th node; the J-th logical voltage value drops to (1/M) times at the J-th node; and a voltage value at the J-th node drops to (1/M) times at the (J−1)th node.

According to the second aspect of the present invention, a testing device for testing an electric device having an A-D converting unit that converts an analog signal to a digital signal, comprises: a rectangular wave generating unit operable to generate a plurality of rectangular waves; a waveform synthesizing unit operable to synthesize the rectangular waves to generate a multi-level synthesized wave; and a waveform generator operable to generate a testing waveform used for testing the electric device based on the synthesized wave, wherein the testing waveform is applied to the electrical device so as to test the electric device based on an output value of the electric device to which the testing waveform is applied.

The rectangular wave generating unit may generate the rectangular waves in such a manner that each rectangular wave rises at a desired rising timing based on a desired waveform and falls at a desired falling timing based on the desired waveform. The testing device may further comprise a filter operable to remove a predetermined frequency component from the synthesized wave.

The rectangular wave generating unit may convert information of a voltage value of each of the rectangular waves stored in a waveform memory into an N-digit base-M number (N and M are integers equal to or larger than 2), generate Nth number of logical voltage values that are voltage values specifying logical values corresponding to the N-digit base-M number, and supply the logical voltage values to the waveform synthesizing unit.

The rectangular wave generating unit may include Nth number of rectangular wave generators operable to generate the M-valued logical voltage values, respectively, and the waveform synthesizing unit obtains $(1/M)^K$ times the logical voltage value supplied from the K-th waveform generator (K is an integer equal to or larger than 1 but does not exceed N) and synthesizes $(1/M)^K$ times the logical voltage values so as to generate the desired waveform.

The waveform synthesizing unit may include a ladder having the Nth number of logical voltage values as inputs. In this case, the Nth number of rectangular wave generators are electrically connected to Nth number of nodes, respectively; the nodes are connected to each other via resistors each having a predetermined resistance; the K-th logical voltage value drops to (1/M) times at the K-th node; and a voltage value at the K-th node drops to (1/M) times at the (K−1)th node.

The waveform synthesizing unit may include a ladder having the Nth number of logical voltage value as inputs. In this case, the J-th rectangular wave generator (J is an integer equal to or larger than 1 but does not exceed (N−1)) is connected to (N−1) nodes; the nodes are connected to each other via resistors each having a predetermined resistance; the N-th rectangular wave generator is connected to the (N−1)th node; the N-th logical voltage value at the (N−1) th node is (1/M) times the N-th logical voltage value; the J-th logical voltage value drops to (1/M) times at the J-th node; and a voltage value at the J-th node drops to (1/M) times at the (J−1)th node.

The testing device may further comprise: a DC tester operable to conduct a DC test of the electric device; a selection unit operable to electrically connect one of the DC tester and the rectangular wave generating unit to the waveform synthesizing unit; and a switching unit operable to switch whether or not the rectangular wave generating unit is electrically connected to the waveform synthesizing unit. In addition, the selection unit may electrically connect either the DC tester or one of the rectangular wave generators having the smallest impedance from the electric device to the rectangular wave generator to the waveform synthesizing unit, and the switching unit may switch whether or not others of the rectangular wave generators are electrically connected to the waveform synthesizing unit.

According to the third aspect of the present invention, a semiconductor device including a testing unit for testing a device unit having an A-D converting unit that converts an analog signal to a digital signal, comprises: a rectangular wave generating unit operable to generate a plurality of rectangular waves; a waveform synthesizing unit operable to synthesize the rectangular waves to generate a synthesized wave; a waveform generator operable to generate a testing waveform used for testing the A-D converting unit based on the synthesized wave; the device unit to which the testing waveform is applied; and the testing unit operable to test the A-D converting unit based on an output value of the device unit to which the testing waveform is applied.

The waveform generating unit may generate the rectangular waves in such a manner that each rectangular wave rises at a desired rising timing based on a desired waveform and falls at a desired falling timing based on the desired waveform. In addition, the semiconductor device may further comprise a filter operable to remove a predetermined frequency component from the synthesized wave.

According to the fourth aspect of the present invention, a waveform generation method for generating a desired waveform, comprises the steps of: generating a plurality of rectangular waves; synthesizing the rectangular waves to generate a multi-level synthesized wave; and generating the desired waveform based on the synthesized wave.

The step of generating the rectangular waves may include the step of generating the rectangular waves in such a manner that each rectangular wave rises at a desired rising timing based on the desired waveform and falls at a desired falling timing based on the desired waveform.

The step of generating the multi-level synthesized wave may include the step of calculating voltage values of the rectangular waves to generate the multi-level synthesized wave. In addition, the waveform generation method may further comprise the step of removing a predetermined frequency component of the synthesized wave after the step of generating the multi-level synthesized wave.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 shows a voltage value output from a D-A converting unit 24 included in the waveform generator 10 shown in FIG. 1.

FIG. 5 is a block diagram showing an exemplary rectangular wave generator 40a.

FIGS. 6, 7, 8 and 9 show exemplary rectangular waves.

FIG. 10 is a diagram explaining an operation of the rectangular wave generator 40a shown in FIG. 5.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 3:
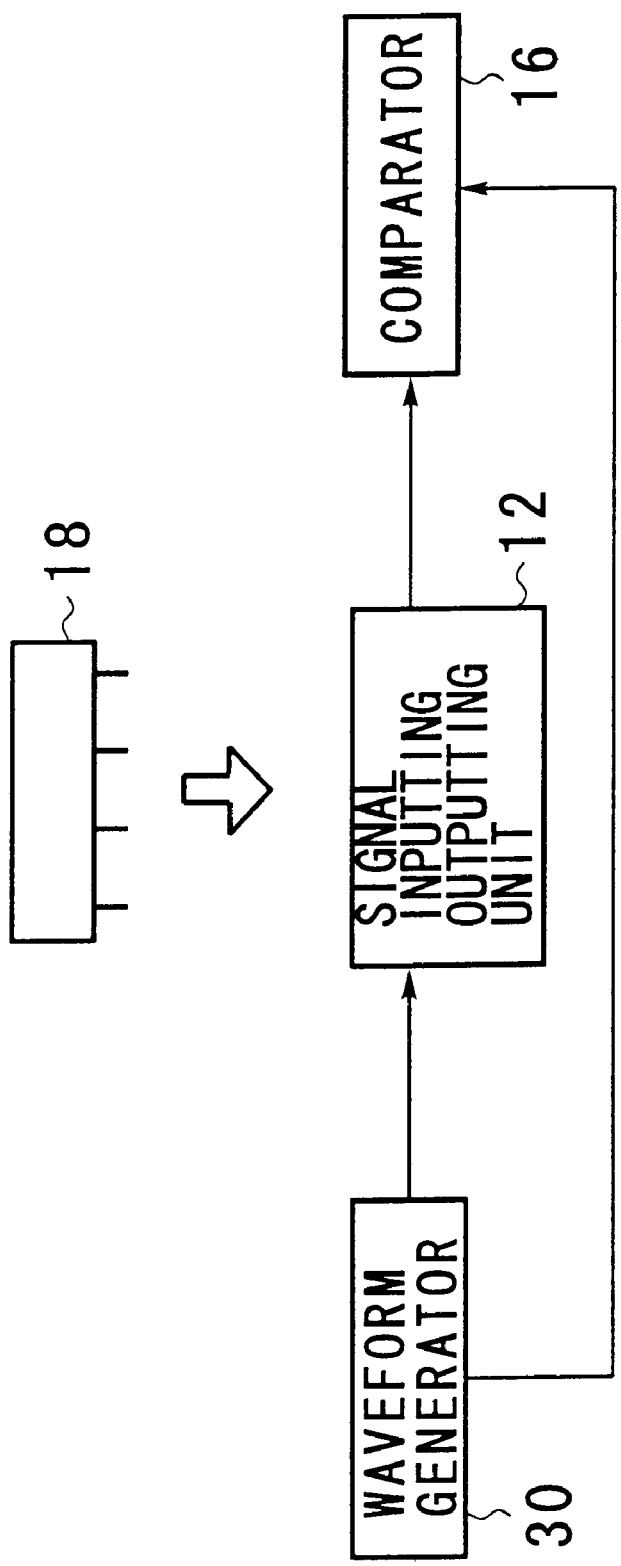
FIG. 3 is a block diagram showing a testing device.

FIG. 3 is a block diagram of an exemplary testing device for testing electric devices each having an A-D converting unit that converts an analog signal into a digital signal. In the present specification, the "electric device" means a device that can operate in a predetermined manner in accordance with a current or a voltage, and includes a semiconductor device having an active element such as an IC (Integrated Circuit) or an LSI (Large-Scale Integrated Circuit). The "electric device" may further include a device composed of the above-mentioned devices integrated with each other to be housed in a single package or a device such as a bread board, that implements a predetermined function by mounting the above-mentioned devices onto a printed circuit board. The testing device shown in FIG. 3 includes a waveform generator 30, a signal inputting/outputting unit 12 and a comparator 16. The waveform generator 30 generates a testing waveform to be used for testing a tested device 18 and outputs the generated testing waveform to the signal inputting/outputting unit 12. The waveform generator 30 also outputs to the comparator 16 an expected value to be output from the tested device 18 to which the testing waveform is applied. The signal inputting/outputting unit 12 applies the testing waveform supplied from the waveform generator 30 to the tested device 18. The tested device 18 outputs an output value in accordance with the testing waveform applied thereto to the signal inputting/outputting unit 12 that outputs the received output value to the comparator 16 that compares the output value of the tested device 18 with the expected value, thereby determining whether or not the tested device 18 is defective.

Figure 4:
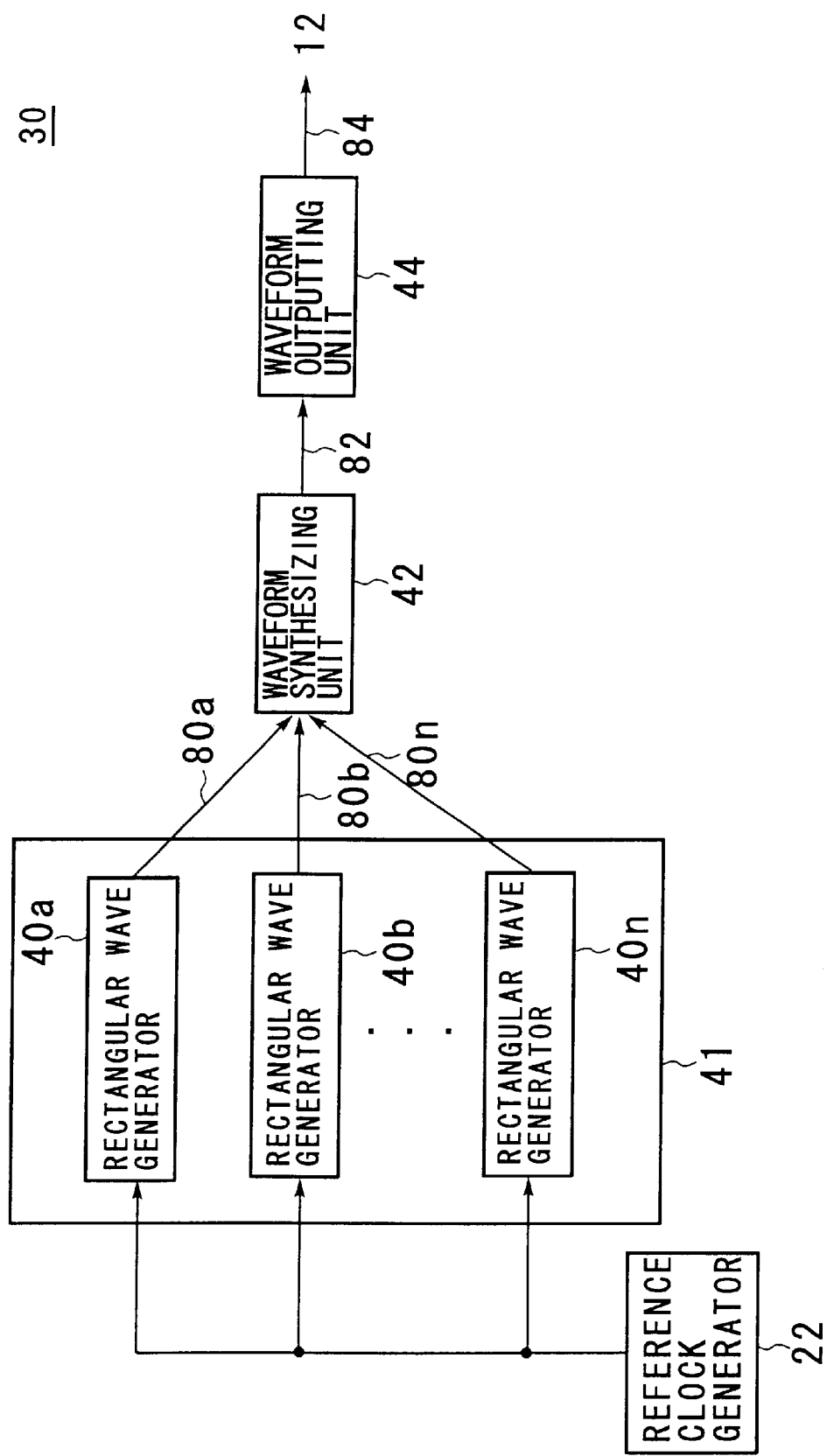
FIG. 4 is a block diagram showing an exemplary waveform generator 30.

FIG. 4 is a block diagram showing an exemplary waveform generator 30. The waveform generator 30 includes a reference clock generator 22, a rectangular wave generating unit 41, a waveform synthesizing unit 42 and a waveform outputting unit 44. The waveform generating unit 41 includes rectangular wave generators 40. The reference clock generator 22 outputs the reference clock to the rectangular wave generators 40. The rectangular wave generators 40 respectively output rectangular waves based on the reference clock to the waveform synthesizing unit 42. The waveform synthesizing unit 42 synthesizes a plurality of rectangular waves supplied from the rectangular wave generators 40 to output a multi-level synthesized wave 82 to the waveform outputting unit 44.

For example, the waveform synthesizing unit 42 may be an adder for adding voltage values of the respective square values to each other. In another embodiment, the waveform synthesizing unit 42 may be a multiplier for multiplying the voltage values of the respective rectangular waves. In still another embodiment, the waveform synthesizing unit 42 may be a subtractor for subtracting the voltage values of the respective square values. In further another embodiment, the waveform synthesizing unit 42 may synthesize the respective rectangular waves by a combination of addition, subtraction and multiplication.

The waveform outputting unit 44 removes a predetermined frequency component from the synthesized wave 82 so as to output a testing waveform 84 to the signal inputting/outputting unit 12. For example, the waveform outputting unit 44 may be a filter for removing the predetermined frequency component from the synthesized wave 82 or a low-pass filter for removing a high-frequency component from the synthesized wave 82.

Figure 5:
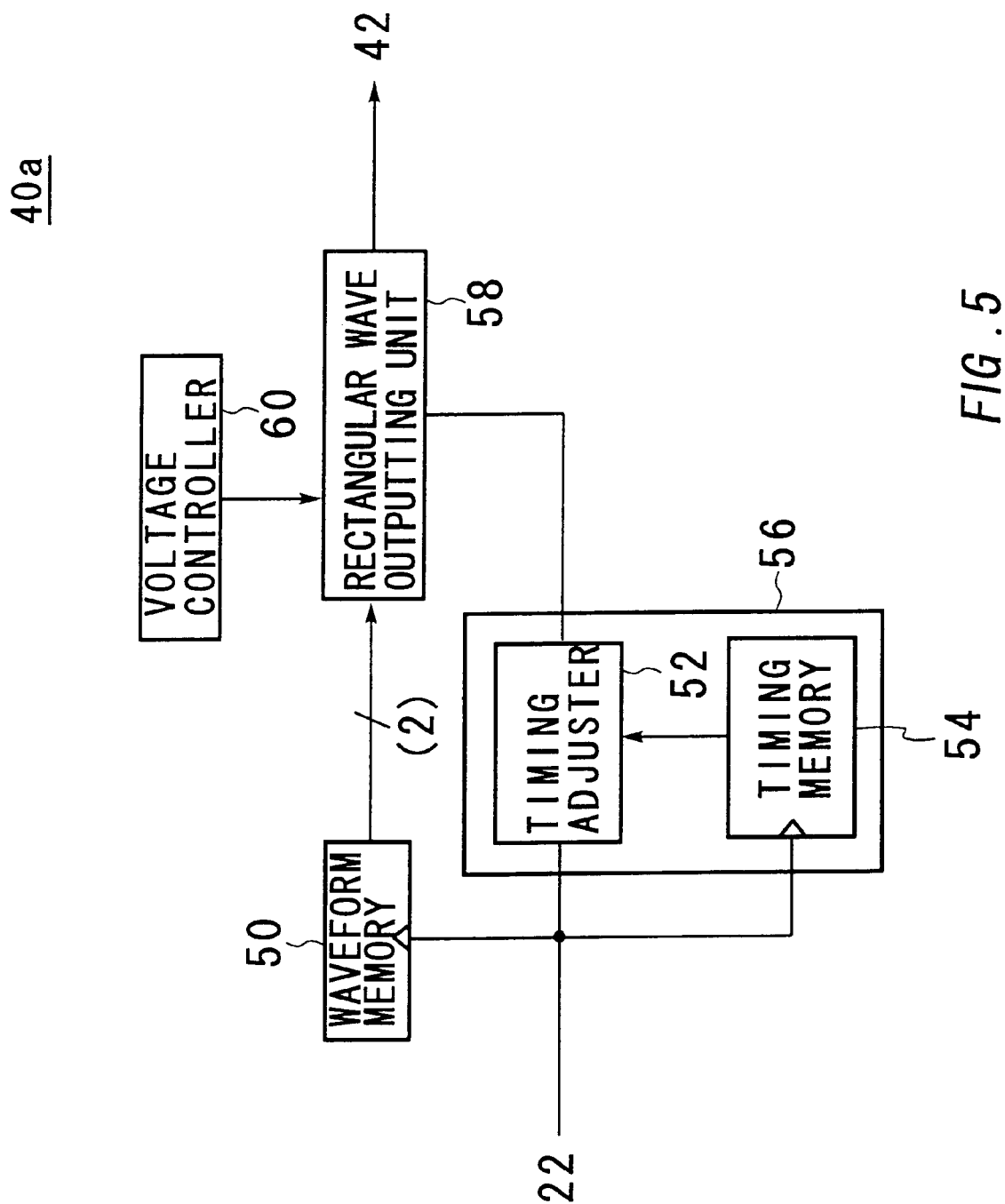

FIG. 5 is a block diagram of an exemplary rectangular wave generator 40. The rectangular wave generators 40-1 to 40-n have the similar structure and function to each other. The rectangular wave generator 40 includes a waveform memory 50, a timing generator 56, a rectangular wave outputting unit 58 and a voltage controller 60. The timing generator 56 has a timing adjuster 52 and a timing memory 54.

The reference clock generator 22 outputs the reference clock to the waveform memory 50, the timing adjuster 52 and the timing memory 54. The waveform memory 50 stores information regarding the voltage value of the rectangular wave, i.e., a rectangular wave pattern, and outputs the information of the voltage value of the rectangular wave to the rectangular wave outputting unit 58 at the timings of the reference clock.

The rectangular wave outputting unit 58 generates the rectangular wave by generating a voltage based on the information of the voltage value. For example, the rectangular wave outputting unit 58 may include a D-A converter for converting a digital signal into an analog signal. In this case, the rectangular wave outputting unit 58 outputs the voltage based on the information of the voltage value supplied as the digital signal. For example, a case where the rectangular wave outputting unit 58 outputs a positive voltage when the information of the voltage value is a logical value "1" and outputs a voltage of 0V when the information of the voltage value is a logical value "0" is considered. When logical values "0011100" are supplied from the waveform memory 50 at the times of the reference clock, respectively, the rectangular wave outputting unit 58 outputs a rectangular wave having a voltage that remains 0V for a period corresponding to two clocks, then changes to a positive voltage for a period corresponding to three clocks and then changes to 0V for a period of two clocks.

The voltage controller 60 controls the magnitude of the voltage generated by the rectangular wave outputting unit 58. The voltage controller 60 can control the voltage generated by the rectangular wave outputting unit 58 based on the logical value (s) supplied from the waveform memory 50. For example, in a case where the waveform memory 50 supplies the logical value "1", the voltage controller 60 can control the voltage generated by the rectangular wave outputting unit 58 to be 5V. For example, when the waveform memory 50 supplies the logical values "0011100" at the times of the reference clock, the rectangular wave outputting unit 58 generates voltage values of 0V, 0V, 5V, 5V, 5V, 0V and 0V in that order.

In another embodiment, it is preferable that the rectangular wave outputting unit 58 can generate a voltage having either one of three voltage values. For example, those three voltage values may be a positive voltage value, zero and a negative voltage value. The waveform memory 50 may store those three voltage values as different sets of two-bit information.

The timing generator 56 generates a timing at which the voltage value is to be generated by the rectangular wave outputting unit 58 based on the reference clock supplied from the reference clock generator 22. The timing memory 54 stores information regarding timings at which the rectangular wave outputting unit 58 changes the voltage value. For example, the timing information may be information specifying each of a rising timing and a falling timing of a rectangular wave. The timing memory 54 outputs the timing information stored therein to the timing adjuster 52 at the timing of the reference clock. The timing adjuster 52 outputs to the rectangular wave outputting unit 58 a timing at which the rectangular wave outputting unit 58 changes the voltage value by delaying the reference clock based on the timing information supplied from the timing memory 54. For example, the timing adjuster 52 may be a variable delay circuit that delays the reference clock in accordance with the timing information. It is preferable that the timing adjuster 52 can delay the reference clock by a time shorter than a period of the reference clock.

The timing generator 56 can freely change the timing at which the rectangular wave outputting unit 58 changes the voltage value. Thus, the rectangular wave outputting unit 58 can output a rectangular wave having a freely-settable duration.

In another embodiment, the rectangular wave generator 41 may include a single waveform memory 50 that corresponds to a plurality of waveform memories 50 combined with each other. Moreover, the rectangular wave generator 41 may include a single timing memory 54 that corresponds to a plurality of timing memories 54 combined with each other.

FIG. 6(a) shows exemplary rectangular waves (80-1, 80-1, 80-1 and 80-1) respectively generated by four rectangular wave generators 40-1, 40-2, 40-3 and 40-4 in a case where the waveform generator 30 shown in FIG. 4 includes the four rectangular wave generators. Each rectangular wave has a voltage value and duration in accordance with the testing waveform. In addition, the rising and falling timings of each rectangular wave can be adjusted irrespective of the period of the reference clock.

FIG. 6(b) shows a synthesized wave 82 obtained by addition of the voltage values of the four rectangular waves shown in FIG. 6(a) by the waveform synthesizing unit 42. The waveform synthesizing unit 42 synthesizes the respective rectangular waves into a multi-level synthesized wave. Since the duration of each rectangular wave can be adjusted irrespective of the period of the reference clock, an interval between times at which the voltage of the synthesized wave 82 changes can be freely adjusted irrespective of the period of the reference clock. Therefore, the testing waveform having higher accuracy than that generated by the conventional waveform generator 10 can be generated. For example, even if the reference clock does not have a high frequency, the testing waveform with higher accuracy can be generated. Moreover, in a case where the rectangular wave outputting unit 58 is implemented by a D-A converter, for example, the testing waveform with higher accuracy than that conventionally generated even if the D-A converter operates at a lower speed than the D-A converter 24 of the conventional waveform generator 10.

FIG. 6(c) shows a testing waveform 84 obtained by removing a predetermined frequency component from the synthesized wave 82 shown in FIG. 6(b) in the waveform outputting unit 44. The testing waveform 84 may use a low-pass filter, for example, and can generate the testing waveform 84 from the waveform shown in FIG. 6(b) by removing a high-frequency component from the synthesized wave 82. Since the synthesized wave 82 shown in FIG. 6(b) can be generated with higher accuracy, the testing waveform 84 having higher accuracy can be generated. Also, since the predetermined frequency component is removed by the waveform outputting unit 44, the testing waveform 84 is a waveform having a voltage value lower than that of a waveform obtained by combining apices of the synthesized wave 82. Therefore, it is preferable to set the voltage value of the rectangular wave shown in FIG. 6(a) by taking the frequency component to be removed by the waveform outputting unit 44 into consideration.

Figure 7:
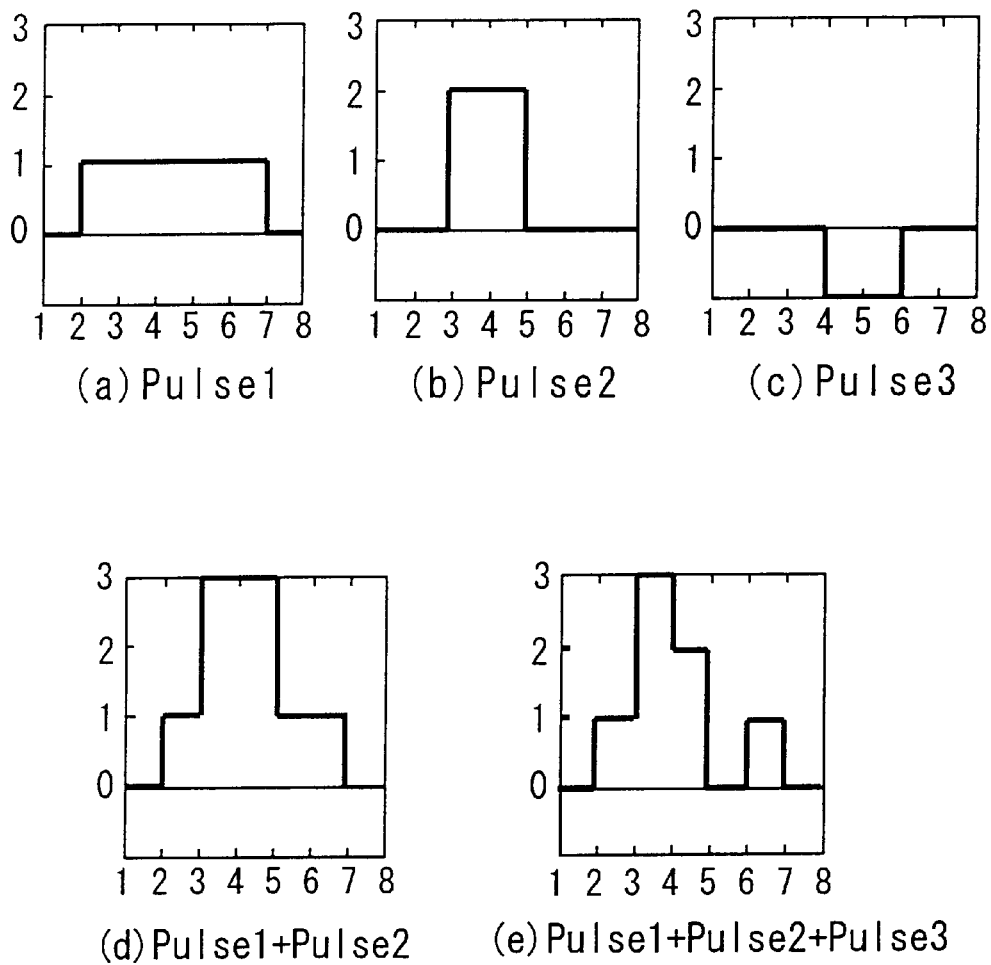

FIG. 7 shows a plurality of exemplary rectangular waves and an exemplary synthesized wave 82 obtained by synthesizing these rectangular waves. In FIG. 7, the horizontal axis represents time while the vertical axis represents a voltage value. One of the rectangular wave generators (40-1 to 40-n) generates a voltage value (amplitude) of 1V from a time 2 to a time 7 so as to generate a rectangular wave shown in FIG. 7(a). Another of the rectangular wave generators (40-1 to 40-n) generates a voltage value (amplitude) of 2V from a time 3 to a time 5 so as to generate a rectangular wave shown in FIG. 7(b). Yet another of the rectangular wave generators (40-1 to 40-n) generates a voltage value (amplitude) of −1V from a time 4 to a time 6 so as to generate a rectangular wave shown in FIG. 7(c).

FIG. 7(d) shows the synthesized wave 82 obtained by adding the rectangular waves respectively shown in FIGS. 7(a) and 7(b). The voltage value of the synthesized wave 82 is 1V from the time 2 to the time 3, 3V from the time 3 to the time 5 and 1V from the time 5 to the time 7.

FIG. 7(e) shows the synthesized wave 82 obtained by adding the rectangular waves shown in FIGS. 7(a), 7(b) and 7(c). The voltage value of the synthesized wave 82 is 1V from the time 2 to the time 3, 3V from the time 3 to the time 4, 2V from the time 4 to the time 5, 0V from the time 5 to the time 6 and 1V from the time 6 to the time 7. As shown in FIGS. 7(d) and 7(e), a plurality of types of the multi-level synthesized wave can be generated by synthesizing a plurality of rectangular waves. Although the waveform of the respective rectangular wave rises and falls at constant intervals in FIG. 7, it is not necessary to set the rising and falling timings of the rectangular wave at constant intervals in another embodiment. In the present specification, the synthesizing of the rectangular waves shown in FIG. 7 is referred to as synthesizing in a voltage-value direction.

Figure 8:
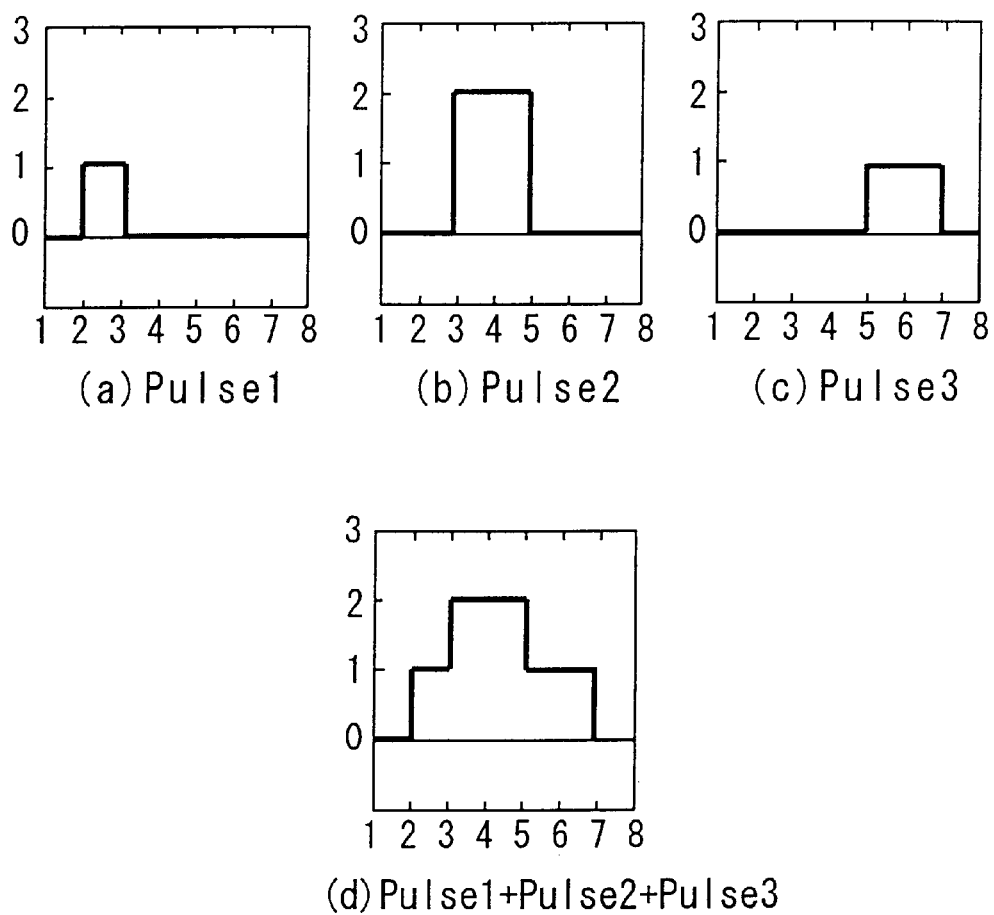

FIG. 8 shows a plurality of exemplary rectangular waves and an exemplary synthesized wave obtained by synthesizing these rectangular waves. In FIG. 8, the horizontal axis represents time while the vertical axis represents a voltage value. One of the rectangular wave generators (40-1 to 40-n) generates a voltage value (amplitude) of 1V from a time 2 to a time 3 so as to generate the rectangular wave shown in FIG. 8(a). Another one of the rectangular wave generators (40-1 to 40-n) generates a voltage value (amplitude) of 2V from a time 3 to a time 5 so as to generate the rectangular wave shown in FIG. 8(b). Still another one of the rectangular wave generators (40-1 to 40-n) generates a voltage value (amplitude) of 1V from a time 5 to a time 7 so as to generate the rectangular wave shown in FIG. 8(c).

FIG. 8(d) shows the synthesized wave 82 obtained by adding the rectangular waves shown in FIGS. 8(a), 8(b) and 8(c). The synthesized wave 82 has a voltage value that is 1V from the time 2 to the time 3, 2V from the time 3 to the time 5, and 1V from the time 5 to the time 7. The rectangular waves may be generated in such a manner that one rectangular wave rises when another rectangular wave falls, as shown in FIGS. 8(a), 8(b) and 8(c). In the present specification, the synthesizing of the rectangular waves shown in FIG. 8 is referred to as synthesizing in a time direction.

Figure 9:
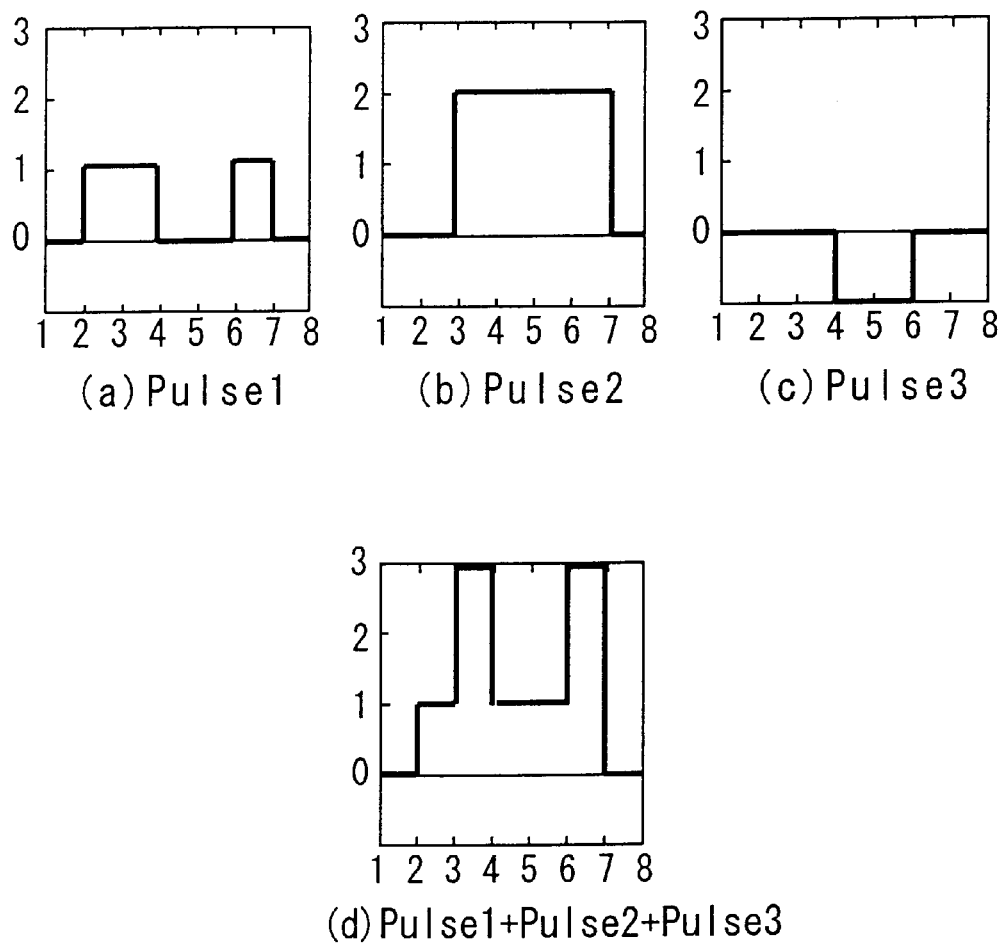

FIG. 9 shows a synthesized wave in a case where the rectangular waves are generated so as to cause the synthesizing of the rectangular waves in the voltage-value direction shown in FIG. 7 and the synthesizing of the rectangular waves in the time direction shown in FIG. 8 to occur simultaneously. In FIG. 9, the horizontal axis represents time while the vertical axis represents a voltage value. One of the rectangular wave generators (40-1 to 40-n) generates a voltage value (amplitude) of 1V from a time 2 to a time 4 and from a time 6 to a time 7 so as to generate a rectangular wave shown in FIG. 9(a). Another one of the rectangular wave generators (40-1 to 40-n) generates a voltage value (amplitude) of 2V from a time 3 to a time 7 so as to generate a rectangular wave shown in FIG. 9(b). Still another one of the rectangular wave generators (40-1 to 40-n) generates a voltage value (amplitude) of −1V from a time 4 to a time 6 so as to generate a rectangular wave shown in FIG. 9(c).

FIG. 9(d) shows a synthesized wave 82 obtained by adding the rectangular waves respectively shown in FIGS. 9(a), 9(b) and 9(c). The synthesized wave 82 has a voltage value that is 1V from the time 2 to the time 3; 3V from the time 3 to the time 4; 1V from the time 4 to the time 6; and 3V from the time 6 to the time 7. The respective rectangular waves may be generated as shown in FIGS. 9(a), 9(b) and 9(c).

FIG. 10 is a diagram used for explaining the operation of the rectangular wave generator 40a explained referring to FIG. 5 more specifically. In FIG. 10, "PATTERN OF RECTANGULAR WAVE" corresponds to the information regarding the voltage value that is stored in the waveform memory 50. "TIMING" represents the timing(s) at which the voltage value is output from the rectangular wave outputting unit 58. "RECTANGULAR WAVE" represents the rectangular wave output from the rectangular wave outputting unit 58. The timing generator 56 generates the timings based on the reference clock supplied at a period $T_R$.

FIG. 10(a) shows the rising and falling of the rectangular wave occurring at times shifted from the timings of the reference clock by $T_A$. The rising and falling timings $T_A$ are stored in the timing memory 54.

When the first reference clock is supplied, the timing memory 54 outputs delay data specifying that the reference clock be delayed by $T_A$ to the timing adjuster 52. The timing adjuster 52 delays the reference clock by $T_A$ so as to output to the rectangular wave outputting unit 58 the timing at which the voltage value is output. The rectangular wave outputting unit 58 outputs the rectangular wave pattern "1" at the timing delayed by $T_A$ from the timing at which the reference clock was supplied to the timing adjuster 52. For example, the rectangular wave pattern "1" generates a positive voltage value.

When the second reference clock is supplied $T_R$ after the first reference clock was supplied, the timing memory 54 outputs to the timing adjuster 52 the delay data specifying that the reference clock is to be delayed by $T_A$. The timing adjuster 52 delays the reference clock by $T_A$ so as to output to the rectangular wave outputting unit 58 the timing for outputting the voltage value. The rectangular wave outputting unit 58 outputs the rectangular wave pattern "0" at a time delayed by $T_A$ from the timing at which the reference clock is supplied to the timing adjuster 52. For example, the rectangular wave pattern "0" causes generation of a voltage value of 0V. As described above, the rectangular wave can be generated at a time freely delayed from the timing of the reference clock.

FIG. 10(b) shows a case in which the rectangular wave rises at a time shifted from the timing of the reference clock by $T_A$ and falls at a time shifted from the timing of the reference clock by $T_B$.

When the first reference clock is supplied, the timing memory 54 outputs the delay data specifying that the reference clock is to be delayed by $T_A$ to the timing adjuster 52. The timing adjuster 52 delays the reference clock by $T_A$ so as to output to the rectangular wave outputting unit 58 the timing of outputting the voltage value. The rectangular wave outputting unit 58 outputs the rectangular wave pattern "1" at a time delayed by $T_A$ from the time at which the reference clock is supplied to the timing adjuster 52. For example, the rectangular wave pattern "1" causes the generation of a positive voltage value.

When the second reference clock is supplied $T_R$ after the supply of the first reference clock, the timing memory 54 outputs the delay data specifying that the reference clock is to be delayed by $T_B$ to the timing adjuster 52. The timing adjuster 52 delays the reference clock by $T_B$ so as to output to the rectangular wave outputting unit 58 the timing of outputting the voltage value. The rectangular wave outputting unit 58 outputs the rectangular wave pattern "0" at a time delayed by $T_B$ from the timing at which the reference clock is supplied to the timing adjuster 52. For example, the rectangular wave pattern "0" causes the generation of a voltage value of 0V. In this way, the rectangular wave can be generated in such a manner that the rising timing of the rectangular wave and the falling timing thereof are shifted from the timings of the reference clock by different time periods.

Figure 1:
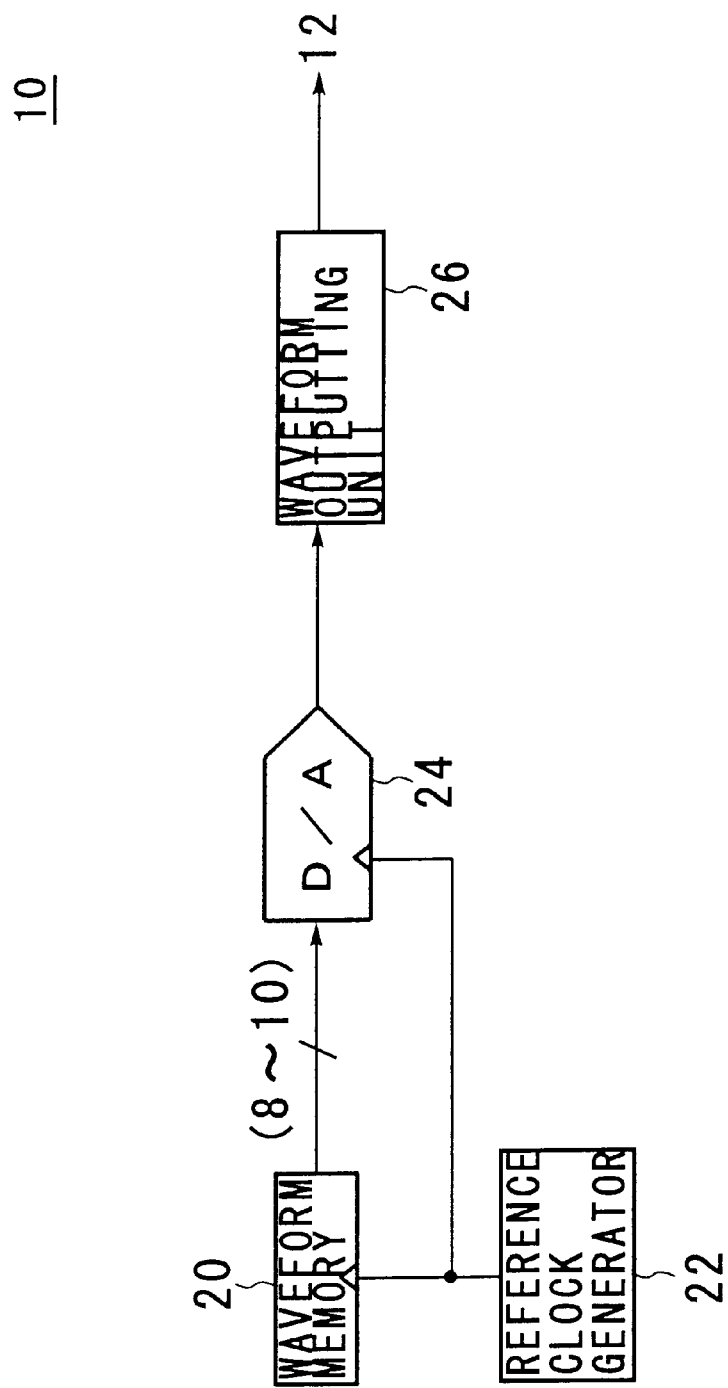
FIG. 1 is a block diagram showing a conventional waveform generator 10.
Figure 11:
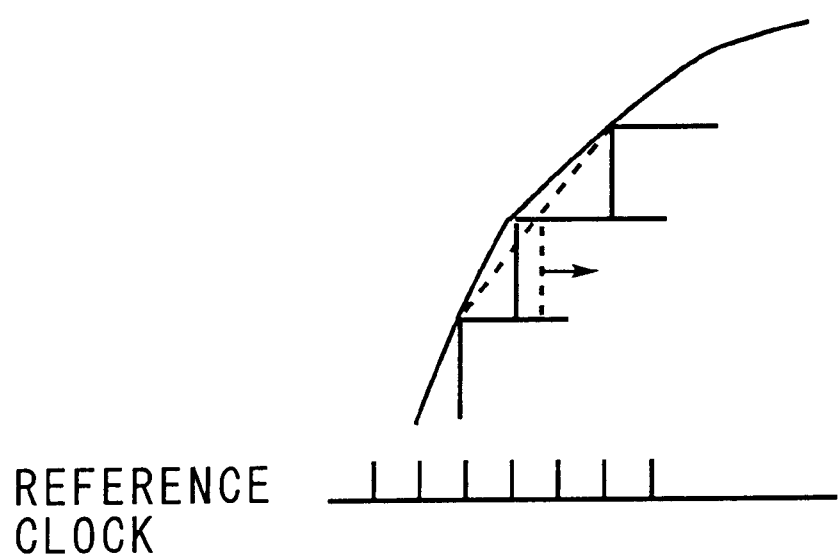
FIG. 11 is a diagram explaining effects obtained by rising and falling timings of the rectangular wave that can be set freely.

FIG. 11 shows effects obtained by the rising and falling timings of the rectangular wave that can be freely set. In FIG. 11, the solid line represents a testing waveform generated by the conventional waveform generator 10 described referring to FIG. 1, while the broken line represents a testing waveform generated by the waveform generator 30 described referring to FIG. 4. Since the D-A converter 24 of the conventional waveform generator 10 shown in FIG. 1 approximates the testing waveform at times (constant intervals) at which the reference clock is supplied, the generated testing waveform is shifted from a desired testing waveform. On the other hand, the rectangular wave generators (40-1 to 40-n) of the waveform generator 30 shown in FIG. 4 can generate the testing waveform having higher accuracy since it can freely change the rising and falling timings of the respective rectangular waves irrespective of the timing of the reference clock.

Figure 12:
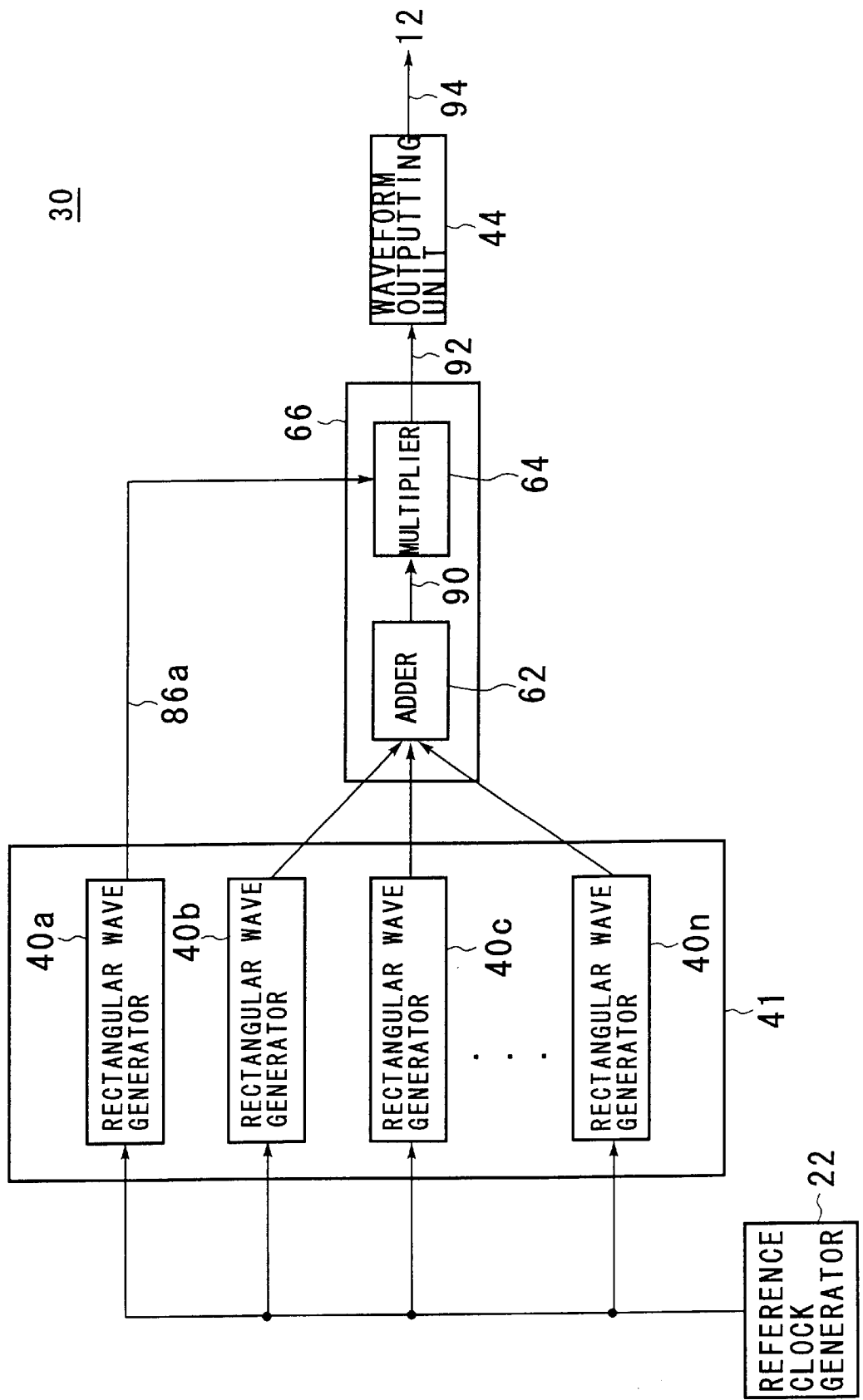
FIG. 12 is a block diagram showing another exemplary waveform generator 30.

FIG. 12 is a block diagram showing another exemplary waveform generator 30. In FIG. 12, the components having the same reference numerals have the same functions as those labeled with the same reference numerals in FIG. 4, and the detailed description thereof is omitted. The waveform generator 30 includes the reference clock generator 22, the rectangular wave generating unit 41, a waveform synthesizing unit 66 and the waveform outputting unit 44. The rectangular wave generating unit 41 includes rectangular wave generators (40-1 to 40-n). The waveform synthesizing unit 66 includes an adder 62 and a multiplier 64. The rectangular wave generators (40-1 to 40-n) respectively generate rectangular waves to output the adder 62. The adder 62 generates a first synthesized wave 90 by adding the voltage value of the rectangular waves. The multiplier 64 multiplies the rectangular wave supplied from the rectangular wave generator 40a and the first synthesized wave 90 together to output a second synthesized wave 92 to the waveform outputting unit 44. The waveform outputting unit 44 removes a predetermined frequency component from the second synthesized wave 92 to output a testing waveform 94.

Figure 13:
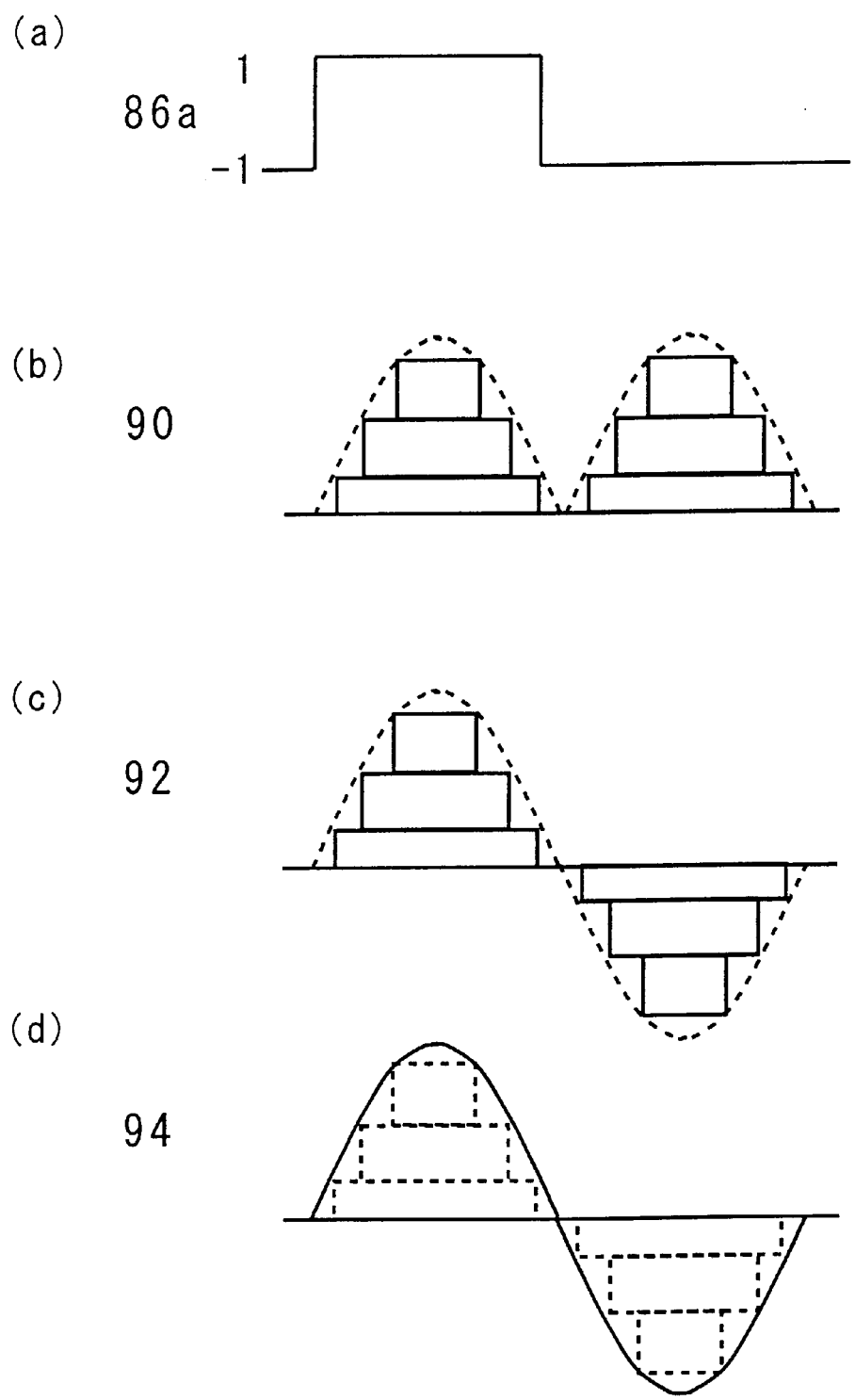
FIG. 13 shows exemplary waveforms generated by the waveform generator 30 shown in FIG. 12.

FIG. 13 shows an exemplary waveform generated by the waveform generator 30 described referring to FIG. 12. FIG. 13(a) shows a rectangular wave 86a generated by the rectangular wave generator 40a. The rectangular wave generator 40a generates the rectangular wave 86a having a voltage value of 1V and a voltage value of −1V.

In FIG. 13(b), a waveform shown with a broken line represents an absolute value of a desired testing waveform. The rectangular wave generators 40b, 40c and 40d generate rectangular waves for generating the waveform shown with a broken line. The adder 62 adds the rectangular waves supplied from the rectangular wave generators 40b, 40c and 40d to generate the first synthesized wave 90 (solid line).

FIG. 13(c) shows the second synthesized wave 92 (solid line) obtained by multiplying the rectangular wave 86a and the first synthesized wave 90 together. In FIG. 13(c), the waveform shown with a broken line is the desired waveform.

FIG. 13(d) shows the testing waveform 94 (solid line) output from the waveform outputting unit 44. In FIG. 13(d), the waveform shown with broken line corresponds to the second synthesized wave 92. In the present embodiment, the desired testing waveform can be generated by multiplying a rectangular wave and the synthesized wave obtained by synthesizing a plurality of rectangular waves. In addition, since the rising and falling timings of the plurality of rectangular waves can be shifted from the timings of the reference clock, a testing waveform having higher accuracy can be generated.

Figure 14:
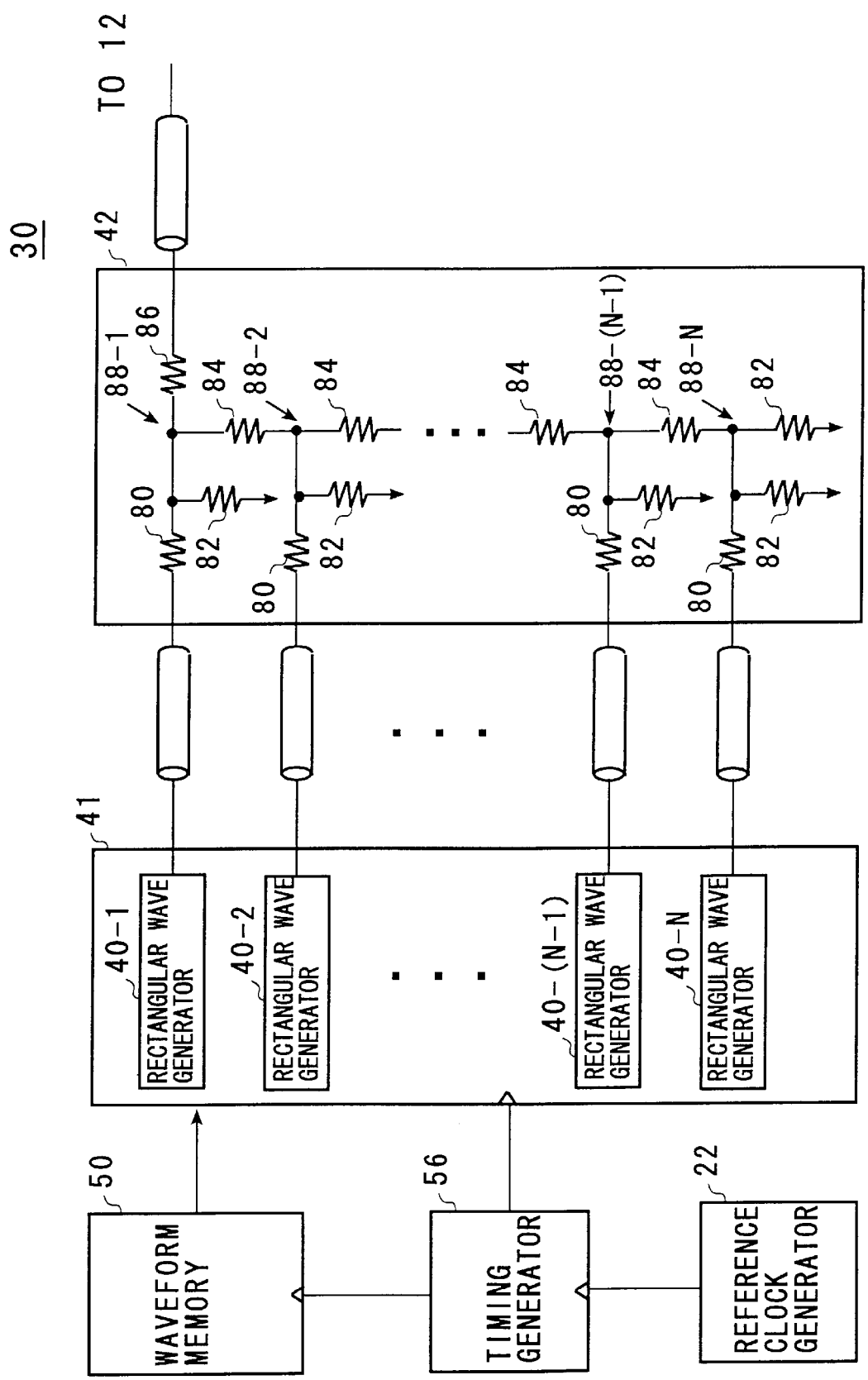
FIG. 14 shows an exemplary waveform generator 30.

FIG. 14 shows an exemplary waveform generator 30. The waveform generator 30 includes a reference clock generator 22, a timing generator 56, a waveform memory 50, a rectangular wave generating unit 41, a selection unit 90, a switching unit 92 and a waveform synthesizing unit 42. The rectangular wave generating unit 41 includes rectangular wave generators (40-1 to 40-N). The waveform synthesizing unit 42 includes resistors (80, 82, 84 and 86). The waveform generator 30 may further include a filter that removes a predetermined frequency component included in a signal generated by the waveform synthesizing unit 42.

The reference clock generator 22 outputs the reference clock to the timing generator 56. The timing generator 56 generates, based on the reference clock supplied from the reference clock generator 22, a timing at which a voltage value is to be generated by the rectangular wave outputting unit 58, so as to supply the generated timing to the waveform memory 50 and the rectangular wave generating unit 41. The waveform memory 50 stores the information regarding the voltage value of the rectangular wave, i.e., the rectangular wave pattern, and outputs the information of the voltage value of the rectangular wave at the timing of the reference clock to the rectangular wave generating unit 41. In another example, each of the rectangular wave generators (40-1 to 40-N) may include the waveform memory 50 and the timing generator 56.

It is preferable that the rectangular wave generating unit converts the information of the voltage value supplied from the waveform memory 50 into N-digit base-M number (N and M are integers equal to or larger than 2) so as to generate Nth number of logical voltage values that are voltage values specifying logical values corresponding to the N-digit base-M number. In the present example, the rectangular wave generators (40-1 to 40-N) respectively correspond to places of the N-digit number, so that each rectangular wave generator generates the logical voltage value of said base-M number. For example, the rectangular wave generators (40-1 to 40-N) may be drivers for testing a digital circuit. In a case where the rectangular wave generating unit 41 converts the information of the voltage value into an N-digit base-three number, the rectangular wave generators (40-1 to 40-N) may select one of a voltage value indicating logical H, a voltage value indicating logical L, a voltage value at a midpoint of the voltage value of logical H and the voltage value of logical L so as to output the selected voltage value. Moreover, each of the rectangular wave generators (40-1 to 40-N) may include a voltage controller for controlling an output voltage thereof.

The waveform synthesizing unit 42 synthesizes the Nth number of logical voltage values supplied from the rectangular wave generating unit 41. It is preferable that the waveform synthesizing unit 42 synthesizes the Nth number of logical voltage values with weights respectively given thereto so as to generate the waveform. For example, the waveform synthesizing unit 42 synthesizes $(1/M)^K$ times the logical voltage value supplied from the K-th rectangular wave generator 40-K (K is an integer that is equal to or larger than 1 but does not exceed N) so as to generate a desired waveform. For example, the waveform synthesizing unit 42 may be a D-A converter.

In this example, the rectangular wave generators (40-1 to 40-N) convert the information of the voltage value into base-three numbers based on the information of the voltage value in the waveform memory so as to generate the logical voltage values, and then supply the generated logical voltage values to the waveform synthesizing unit 42. Each of the rectangular wave generators (40-1 to 40-N) converts said information of the voltage value into a base-three number by selecting one of the voltage values of logical H, the voltage value of logical L and a comparator-reference-voltage for detecting logical H or logical L.

In this example, the waveform synthesizing unit 42 includes a ladder that has a plurality of resisters (80, 82, 84, and 86). The ladder inputs the Nth number of logical voltage values corresponding to the Nth number of places of said information of the voltage value that has been converted into a base-three number. It is preferable that the Nth number of rectangular wave generators (40-1 to 40-N) are electrically connected to Nth number of nodes (88-1 to 88-N), respectively, and the Nth number of nodes (88-1 to 88-N) are connected to each other via resistors each having a predetermined electric resistance.

In the waveform synthesizing unit 42, it is preferable that the logical voltage value supplied from the K-th rectangular wave generator (40-K) drops to 1/M times at the K-th node (88-K), and it is also preferable that the voltage value at the K-th node (88-K) drops to 1/M times at the (K−1)th node (88-(K−1)).

For example, in a case where each resistor 82 has the resistance of 3R, in the waveform synthesizing unit 42 it is preferable that each resistor 84 has the resistance of 2R and is grounded at one end. In this case, the resistance value of each resistor 80 is preferably set in such a manner that the sum of the impedances from the rectangular wave generators (40-1 to 40-N) to the resistor 80 is 3R, while the resistor 86 is preferably set in such a manner that the sum of the impedances from the tested device to the resistor 86 is 3R. For example, in a case where a transmission line is provided between the rectangular wave generating unit 41 and the waveform synthesizing unit 42, the impedance of said transmission line is to be considered.

The logical voltage value output from the K-th rectangular wave generator (40-K) drops to one third at the K-th node (80-K), and is further made to fall to one third at the (K−1)th node (80-(K−1)). Thus, the waveform synthesizing unit 42 can weigh the logical voltage values respectively output from the rectangular wave generators (40-1 to 40-N) and synthesize the weighed logical voltage values, thereby a desired waveform can be generated.

Figure 15:
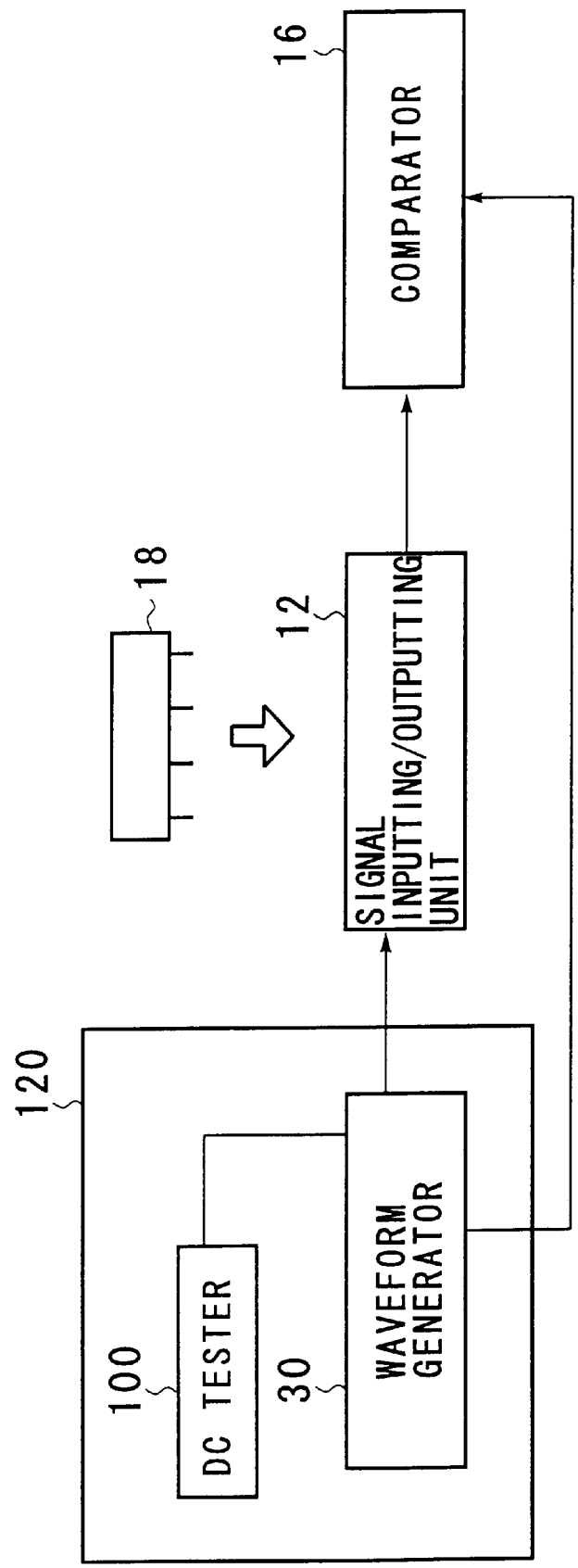
FIG. 15 shows another exemplary testing device that can test an electric device having an A-D converting unit for converting an analog signal into a digital signal.

FIG. 15 shows a testing device for testing electric devices each having an A-D converting unit that converts an analog signal to a digital signal according to another embodiment of the present invention. The testing device may be a mixed-signal testing device for testing the tested device in which both an analog circuit and a digital circuit are included.

The testing device includes a testing signal generating unit 120, a signal inputting/outputting unit 12 and a comparator 16. The testing signal generating unit 120 includes a DC tester 100 for conducting a DC test for the tested device and a waveform generator 30. The testing signal generating unit 120 may be a digital signal testing device that conducts a test of a digital circuit.

The waveform generator 30 generates a testing waveform used for a test of the tested device 18 so as to output the testing waveform to the signal inputting/outputting unit 12. Moreover, the waveform generator 30 outputs an expected value to be output from the tested device 18 when the testing waveform is applied to the tested device 18 to the comparator 16. The signal inputting/outputting unit 12 applies the testing waveform supplied from the waveform generator 30 to the tested device 18. The tested device 18 outputs an output value in accordance with the applied testing waveform to the signal inputting/outputting unit 12 that outputs the output value of the tested device to the comparator 16. The comparator 16 compares the output value with the expected value so as to determine whether the tested device is defective.

Figure 16:
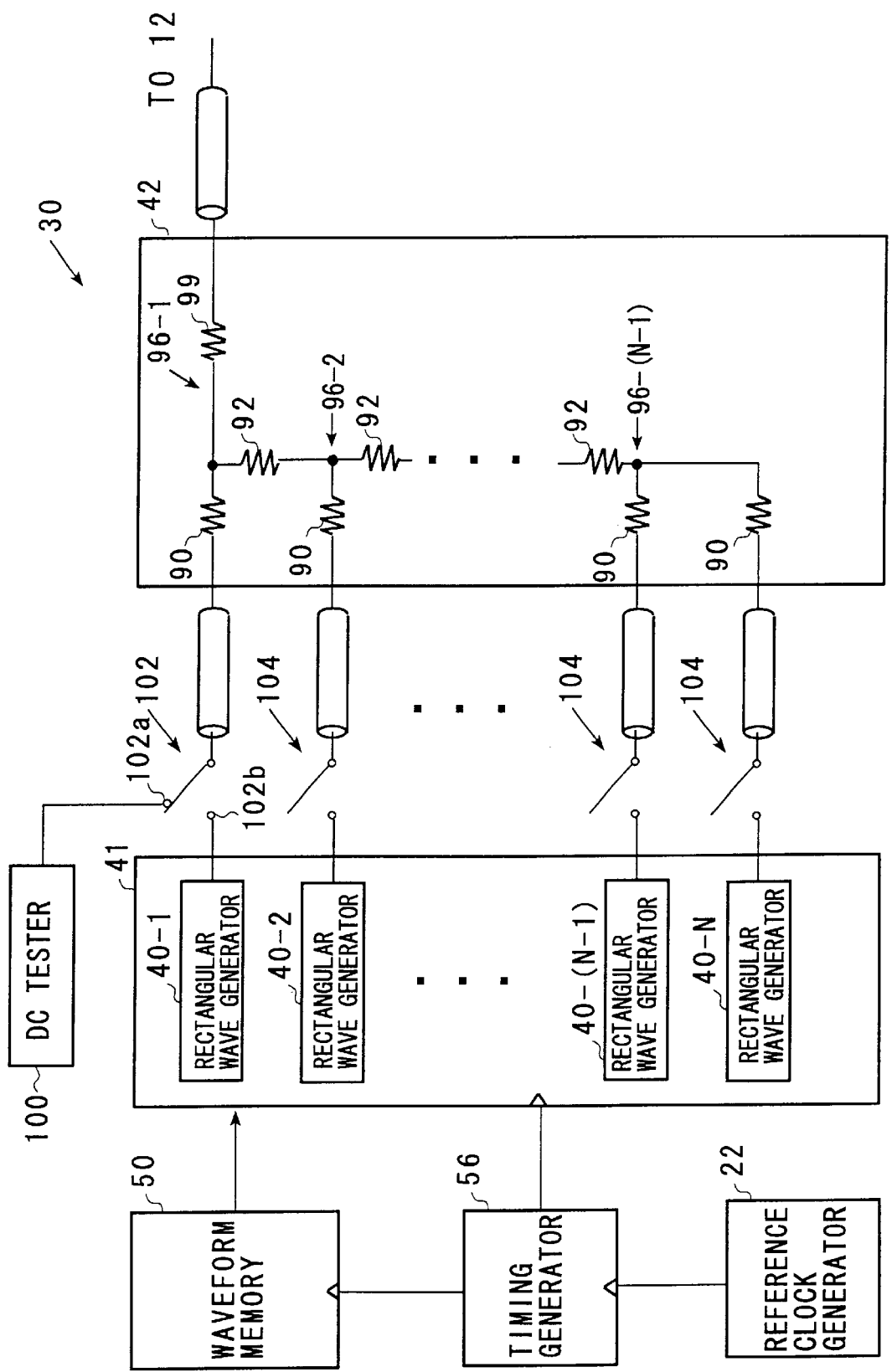
FIG. 16 shows an exemplary waveform generator 30.

FIG. 16 shows an exemplary waveform generator 30. The waveform generator 30 includes a reference clock generator 22, a timing generator 56, a waveform memory 50, a rectangular wave generating unit 41, a selection unit 102, a switching unit 104 and a waveform synthesizing unit 42. The rectangular wave generating unit 41 includes rectangular wave generators (40-1 to 40-N). The waveform synthesizing unit 42 includes resistors 90, 92 and 94.

The selection unit 102 connects the DC tester 100 to the waveform synthesizing unit 42 by being switched to a terminal 102a in a case of the DC test, such as a contact test, for checking electric connection between the tested device and the testing signal generating unit 120. At that time, it is desirable to make the switching unit 104 open so as not to connect the rectangular wave generating unit 41 to the waveform synthesizing unit 42. In addition, it is desirable in a case of an analog signal test that the rectangular wave generating unit 41 is connected to the waveform synthesizing unit 42 by switching the selection unit 102 to a terminal 102b or by causing a short-circuit in the switching unit 104. Moreover, it is preferable that the selection unit 102 electrically connects either the rectangular wave generator (40-1) having the smallest impedance between the tested device and said rectangular wave generator or the DC tester 100 to the waveform synthesizing unit 42. In this case, the switching unit 104 is preferably switched whether or not the rectangular wave generator (40-1) having the smallest impedance between the tested device and said rectangular wave generator is connected to the waveform synthesizing unit 42.

The reference clock generator 22 outputs the reference clock to the timing generator 56. The timing generator 56 generates the timing of generating the voltage value by the rectangular wave outputting unit 58 based on the reference clock supplied from the reference clock generator 22, thereby supplying the generated timing to the waveform memory 50 and the rectangular wave generating unit 41. The waveform memory 50 stores information of the voltage value of the rectangular wave, i.e., a rectangular wave pattern, and outputs the information of the voltage value of the rectangular wave at the timing of the reference clock. In another example, each of the rectangular wave generators (40-1 to 40-N) may include the waveform memory 50 and the timing generator 56.

It is preferable that the rectangular wave generating unit converts the information of the voltage value supplied from the waveform memory 50 into an N-digit base-M number (N and M are integers equal to or larger than 2) so as to generate Nth number of logical voltage values that are voltage values specifying logical values corresponding to the N-digit base-M number. In the present example, the rectangular wave generators (40-1 to 40-N) respectively correspond to places of said N-digit number, so that each rectangular wave generator generates the logical voltage value of said base-M number. For example, the rectangular wave generators (40-1 to 40-N) may be drivers for testing digital circuits. In a case where the rectangular wave generating unit 41 converts said information of the voltage value into an N-digit base-three number, the rectangular wave generators (40-1 to 40-N) may select one of a voltage value of logical H, a voltage value of logical L, a voltage value at a midpoint of the voltage value of logical H and the voltage value of logical L so as to output the selected voltage value. Moreover, each of the rectangular wave generators (40-1 to 40-N) may include a voltage controller for controlling an output voltage thereof.

The waveform synthesizing unit 42 synthesizes the Nth number of logical voltage values supplied from the rectangular wave generating unit 41. It is preferable that the waveform synthesizing unit 42 weighs the Nth number of logical voltage values and synthesizes the weighed logical voltage values so as to generate the waveform. For example, the waveform synthesizing unit 42 synthesizes $(1/M)^J$ times the logical voltage value supplied from the J-th rectangular wave generator 40-J (J is an integer that is equal to or larger than 1 but does not exceed (N−1)) so as to generate a desired waveform. For example, the waveform synthesizing unit 42 may be a D-A converter. In addition, each of the rectangular wave generators (40-1 to 40-N) may supply a voltage value that is 1/M times the logical voltage value.

In this example, the rectangular wave generators (40-1 to 40-(N−1)) generate the logical voltage values by converting the information of the voltage value into binary numbers based on said information of the voltage value in the waveform memory, and then supplying said logical voltage values to the waveform synthesizing unit 42. Each of the rectangular wave generators (40-1 to 40-(N−1)) converts said information of the voltage value into binary number by selecting the voltage value of logical H or the voltage value of logical L. Moreover, the N-th rectangular wave generator 40-N supplies a fallen logical voltage value obtained by making the logical value corresponding to said information of the voltage value fall to a half thereof to the waveform synthesizing unit 42. In another example, the N-th rectangular wave generator 40N may output said logical voltage value, and the fallen logical voltage value obtained by making said logical voltage value fall to a half thereof may be supplied to the waveform synthesizing unit 42.

In this example, the waveform synthesizing unit 42 includes a ladder that inputs Nth number of logical voltage values corresponding to Nth number of places of said information of the voltage value that has been converted into binary numbers and that has a plurality of resistors (90, 92 and 94). It is preferable that the Nth number of rectangular wave generators (40-1 to 40-(N−1)) are electrically connected to (N−1) nodes (96-1 to 96-(N−1)), respectively, and the nodes (96-1 to 96-(N−1)) are connected to each other via resistors 92 each having a predetermined electric resistance.

In the waveform synthesizing unit 42, it is preferable that the logical voltage value supplied from the J-th rectangular wave generator (40-J) drops to 1/M times at the J-th node (96-J), and it is also preferable that the voltage value at the J-th node (96-J) drops to 1/M times at the (J−1)th node (96-(J−1)).

In addition, it is preferable to connect the N-th rectangular wave generator 40-N to the (N−1)th node (96-(N−1)). Moreover, it is preferable that the fallen logical voltage value that is obtained by making the logical voltage value fall to 1/M times and is output from the N-th rectangular wave generator (40-N) is 1/M times said fallen logical voltage value at the (N−1)th node (96-(N−1).

For example, in a case where each resistor 92 has the resistance of R, in the waveform synthesizing unit 42 it is preferable that the resistance of each resistor 90 is set in such a manner that the sum of the impedances from the rectangular wave generators (40-1 to 40-N) to said resistor 90 is 2R. Also, it is preferable to set the resistance of the resistor 94 in such a manner that the sum of the impedances from the tested device to the resistor 94 is 2R. For example, in a case where a transmission line is provided between the rectangular wave generating unit 41 and the waveform synthesizing unit 42, the impedance of said transmission line is to be considered.

The logical voltage value output from the J-th rectangular wave generator (40-J) drops to a half at the J-th node (80-J), and is further made to fall to a half at the (J−1)th node (80-(J−1)). In addition, the fallen logical voltage value output from the N-th rectangular wave generator (40-N) is equal to a half of said fallen logical voltage value at the (N−1)th node (96-(N−1)). Thus, the waveform synthesizing unit 42 can weigh the logical voltage values respectively output from the rectangular wave generators (40-1 to 40-N) and synthesize the weighed logical voltage values, thereby a desired waveform can be generated.

Figure 17:
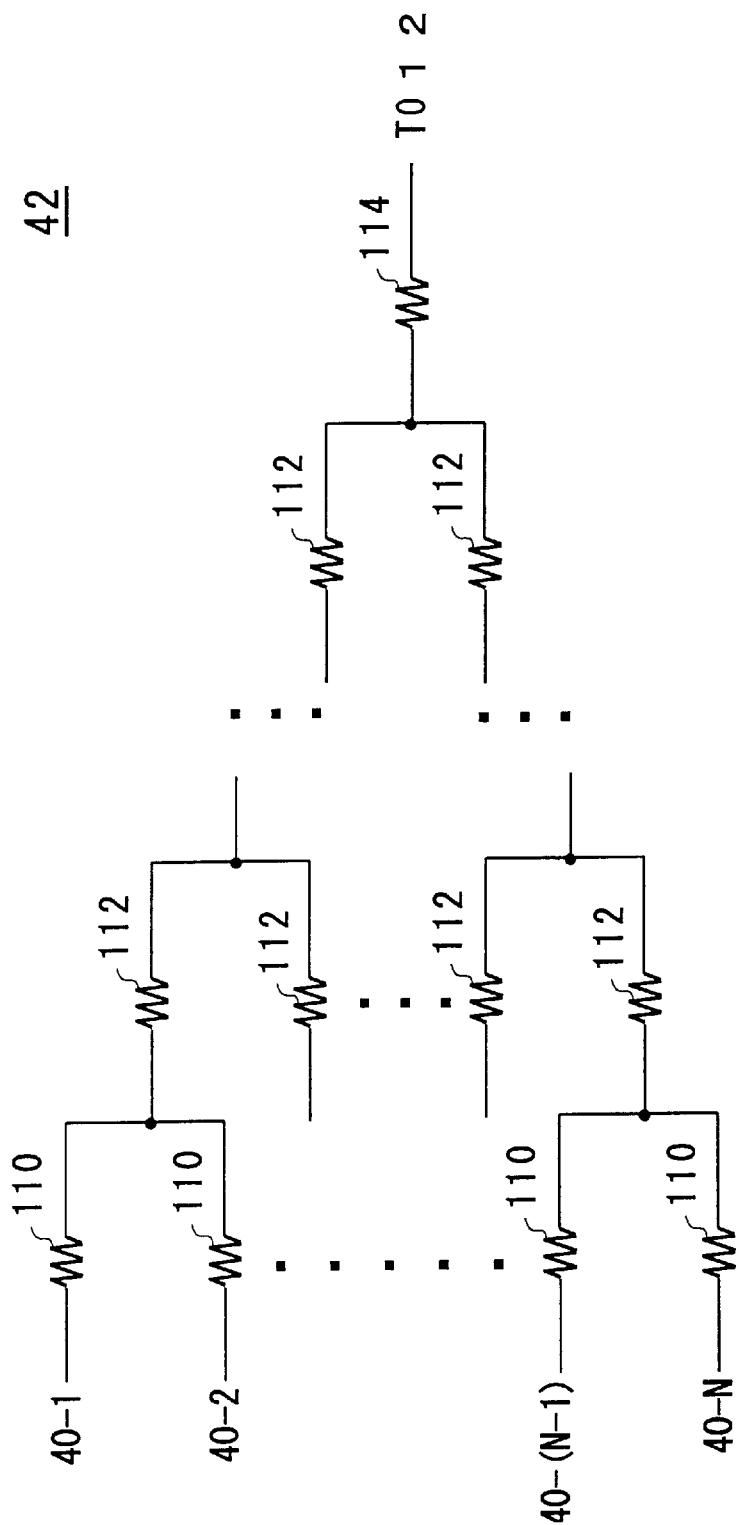
FIG. 17 shows an exemplary waveform synthesizing unit 42.

FIG. 17 shows another exemplary waveform synthesizing unit 42. The waveform synthesizing unit 42 includes a plurality of resistors (110, 112 and 114). In a case where the rectangular wave generating unit 41 outputs the logical values corresponding to the N-digit base-M number, the waveform synthesizing unit 42 weighs the Nth number of logical voltage values by using base-M weights, respectively, and synthesizes the weighed logical voltage values, so as to output the synthesizing result. It is preferable to set the resistance of each of the resistors (110 and 112) in such a manner that a ratio of the sum of the impedances from the rectangular wave generators (40-1 to 40-N) to the resistors 110 to the resistance of the resistor 112 is M:M/2. In addition, the resistance of the resistor 114 is preferably set so as to set a ratio of the sum of the impedances from the tested device to the resistor 114 to the resistance of the resistor 112 to M/2 : M. In other words, the waveform synthesizing unit 42 can be any circuit as long as the waveform synthesizing unit 42 can ensure the impedance matching and can weigh the M-valued logical voltage value supplied thereto by using powers of M so as to synthesize the weighed logical voltage values.

In the waveform generator 30 of the present invention, the resistors (90, 92, 94, 110, 112 and 114) are not grounded. Therefore, it is possible to supply a current generated in the DC tester 100 to the tested device very efficiently. In addition, since the waveform generator 30 does not include a selection unit such as a relay or a switch for selecting one of the DC test and the analog-signal test between the waveform synthesizing unit 42 and the tested device, it is possible to greatly reduce degradation of the analog testing signal caused by such a selection unit even if the analog-signal test is conducted. Moreover, the testing device of the present invention can generate a desired analog testing waveform by using a driver included in a digital-circuit testing device. Therefore, a waveform generating device that can freely generate a waveform is not necessary, thereby reducing the size of the testing device greatly.

Figure 18:
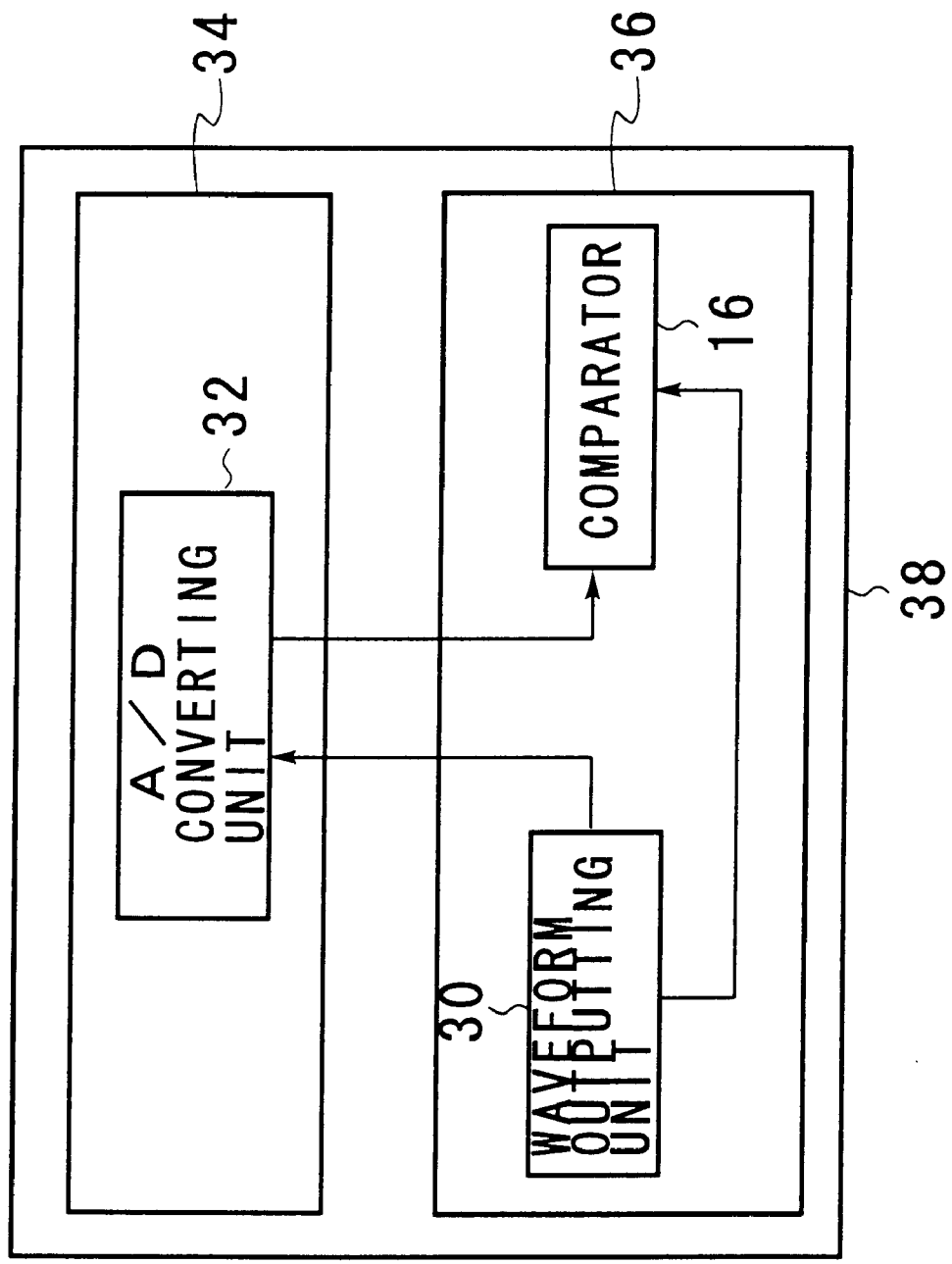
FIG. 18 is a block diagram showing a semiconductor device 38 having a testing unit.

FIG. 18 is a block diagram showing an exemplary semi-conductor device that can conduct self-check of an A-D converter included therein. In FIG. 18, the components having the same functions as those shown in FIG. 3 are labeled with the same reference numerals as those in FIG. 3. Moreover, since the components having the same reference numerals as those in FIG. 3 have the same functions as those in FIG. 3, the description thereof is omitted. The semiconductor device 38 includes a tested device unit 34 and a testing unit 36. The tested device unit 34 includes an A-D converter 32. The testing unit 36 includes the waveform generator 30 and the comparator 16.

The waveform generator 30 generates a testing waveform used for testing the A-D converter 32 and applies the generated testing waveform to the A-D converter 32. Also, the waveform generator 30 outputs an expected value to be output from the A-D converter 32 when the testing waveform is applied to the A-D converter 32 to the comparator 16. The A-D converter 32 outputs an output value in accordance with the applied testing waveform to the comparator 16. The comparator 16 compares the output value with the expected value so as to determine whether or not the A-D converter 32 is defective.

As described above, according to the present invention, a testing waveform can be freely generated with high accuracy.

Although the present invention has been described by way of exemplary embodiments, it should be understood that those skilled in the art might make many changes and substitutions without departing from the spirit and the scope of the present invention which is defined only by the appended claims.

What is claimed is:

1. A waveform generator for generating a desired waveform comprising:
   a rectangular wave generating unit operable to generate a plurality of rectangular waves; and
   a waveform synthesizing unit operable to synthesize said plurality of rectangular waves to generate a multi-level synthesized wave, wherein said desired waveform is generated based on said synthesized wave.

2. A waveform generator as claimed in claim 1, wherein said rectangular wave generating unit generates said plurality of rectangular waves in such a manner that each of said plurality of rectangular waves rises at a desired rising timing based on said desired waveform and falls at a desired falling timing based on said desired waveform.

3. A waveform generator as claimed in claim 1 or 2, further comprising a filter operable to remove a predetermined frequency component from said synthesized wave.

4. A waveform generator as claimed in claim 1, wherein said rectangular wave generating unit includes a waveform memory operable to store information regarding a voltage value of each of said plurality of rectangular waves.

5. A waveform generator as claimed in claim 2, wherein said rectangular wave generating unit further includes:
   a timing memory operable to store said rising timing and said falling timing of each of said plurality of rectangular waves; and
   a rectangular wave outputting unit operable to output each of said plurality of rectangular waves based on said information and said timing of each of said rectangular waves.

6. A waveform generator as claimed in claim 2, wherein said rectangular wave generating unit includes:
   a plurality of waveform memories each operable to store information of a voltage value of a corresponding one of said plurality of rectangular waves;
   a plurality of timing memories each operable to store said rising and falling timing of a corresponding one of said plurality of rectangular waves; and
   a rectangular wave outputting unit operable to output said rectangular waves based on said information to be output of each of said rectangular waves and said timing of each of said rectangular waves.

7. A waveform generator as claimed in claim 5, wherein said rectangular wave outputting unit is a D-A converter that converts said information of the voltage value into an analog signal.

8. A waveform generator as claimed in claim 5, further comprising a timing adjuster operable to delay a reference clock based on said timing of each of said rectangular waves stored in said timing memory of each of said timing memories.

9. A waveform generator as claimed in claim 1, further comprising a voltage controller operable to control an amplitude of each of said plurality of rectangular waves based on said desired waveform.

10. A waveform generator as claimed in claim 1, wherein said waveform synthesizing unit performs an operation for the voltage value of each of said plurality of rectangular waves.

11. A waveform generator as claimed in claim 5, wherein said rectangular wave generating unit converts said information of the voltage value stored in said waveform memory into an N-digit base-M number (N and M are integers equal to or larger than 2), generates Nth number of logical voltage values that are voltage values specifying logical values corresponding to said N-digit base-M number, and supplies said logical voltage values to said waveform synthesizing unit.

12. A waveform generator as claimed in claim 11, wherein said rectangular wave generating unit includes Nth number of rectangular wave generators operable to generate said M-valued logical voltage values, respectively, and
   said waveform synthesizing unit multiples, by $(1/M)^K$ times, each of said logical voltage values that is supplied from the K-th waveform generator (K is an integer equal to or larger than 1 but does not exceed N) and synthesizes multipled said logical voltage values so as to generate said desired waveform.

13. A waveform generator as claimed in claim 12, wherein said waveform synthesizing unit includes a ladder having said Nth number of logical voltage values as inputs,
   said Nth number of rectangular wave generators are electrically connected to Nth number of nodes, respectively,
   said nodes are connected to each other via resistors each having a predetermined resistance,
   the K-th logical voltage value drops to (1/M) times at the K-th node, and
   a voltage value at said K-th node drops to (1/M) times at the (K−1)th node.

14. A waveform generator as claimed in claim 12, wherein said waveform synthesizing unit includes a ladder having said Nth number of logical voltage value as inputs,
   the J-th rectangular wave generator (J is an integer equal to or larger than 1 but does not exceed (N−1)) is connected to (N−1) nodes,
   said nodes are connected to each other via resistors each having a predetermined resistance,
   the N-th rectangular wave generator is connected to the (N−1)th node,
   the N-th logical voltage value falls to (1/M) times said N-th logical voltage value at said (N−1)th node,
   the J-th logical voltage value drops to (1/M) times at the J-th node, and
   a voltage value at said J-th node drops to (1/M) times at the (J−1)th node.

15. A testing device for testing an electric device having an A-D converting unit that converts an analog signal to a digital signal, comprising:
   a rectangular wave generating unit operable to generate a plurality of rectangular waves;
   a waveform synthesizing unit operable to synthesize said plurality of rectangular waves to generate a multi-level synthesized wave; and a waveform generator operable to generate a testing waveform used for testing said electric device based on said synthesized wave, wherein said testing waveform is applied to said electrical device so as to test said electric device based on an output value of said electric device to which said testing waveform is applied.

16. A testing device as claimed in claim 15, wherein said rectangular wave generating unit generates said plurality of rectangular waves in such a manner that each of said plurality of rectangular waves rises at a desired rising timing based on a desired waveform and falls at a desired falling timing based on a desired waveform.

17. A testing device as claimed in claim 15 or 16, further comprising a filter operable to remove a predetermined frequency component from said synthesized wave.

18. A testing device as claimed in claim 16, wherein said rectangular wave generating unit converts information of a voltage value of each of said rectangular waves stored in a waveform memory into an N-digit base-M number (N and M are integers equal to or larger than 2), generates Nth number of logical voltage values that are voltage values specifying logical values corresponding to said N-digit base-M number, and supplies said logical voltage values to said waveform synthesizing unit.

19. A testing device as claimed in claim 18, wherein said rectangular wave generating unit includes Nth number of rectangular wave generators operable to generate said M-valued logical voltage values, respectively, and said waveform synthesizing unit multiples, by $(1/M)^K$ times, each of said logical voltage values that is supplied from the K-th waveform generator (K is an integer equal to or larger than 1 but does not exceed N) and synthesizes $(1/M)^K$ times said logical voltage values so as to generate said desired waveform.

20. A testing device as claimed in claim 19, wherein said waveform synthesizing unit includes a ladder having said Nth number of logical voltage values as inputs, said Nth number of rectangular wave generators are electrically connected to Nth number of nodes, respectively, said nodes are connected to each other via resistors each having a predetermined resistance, the K-th logical voltage value drops to (1/M) times at the K-th node, and a voltage value at said K-th node drops to (1/M) times at the (K−1)th node.

21. A testing device as claimed in claim 19, wherein said waveform synthesizing unit includes a ladder having said Nth number of logical voltage value as inputs, the J-th rectangular wave generator (J is an integer equal to or larger than 1 but does not exceed (N−1) ) is connected to (N−1) nodes, said nodes are connected to each other via resistors each having a predetermined resistance, the N-th rectangular wave generator is connected to the (N−1)th node, the N-th logical voltage value at said (N−1) th node is (1/M) times said N-th logical voltage value, the J-th logical voltage value drops to (1/M) times at the J-th node, and a voltage value at said J-th node drops to (1/M) times at the (J−1)th node.

22. A testing device as claimed in any one of claims 18 to 21, further comprising:

a DC tester operable to conduct a DC test of said electric device;

a selection unit operable to electrically connect one of said DC tester and said rectangular wave generating unit to said waveform synthesizing unit; and a switching unit operable to switch whether or not said rectangular wave generating unit is electrically connected to said waveform synthesizing unit.

23. A testing device as claimed in claim 22, wherein said selection unit electrically connects either said DC tester or one of said rectangular wave generators having the smallest impedance from said electric device to said rectangular wave generator to said waveform synthesizing unit, and said switching unit switches whether or not others of said rectangular wave generators is electrically connected to said waveform synthesizing unit.

24. A semiconductor device including a testing unit for testing a device unit having an A-D converting unit that converts an analog signal to a digital signal, comprising:

a rectangular wave generating unit operable to generate a plurality of rectangular waves;

a waveform synthesizing unit operable to synthesize said plurality of rectangular waves to generate a synthesized wave;

a waveform generator operable to generate a testing waveform used for testing said A-D converting unit based on said synthesized wave;

said device unit to which said testing waveform is applied; and said testing unit operable to test said A-D converting unit based on an output value of said device unit to which said testing waveform is applied.

25. A semiconductor device as claimed in claim 24, wherein said waveform generating unit generates said plurality of rectangular waves in such a manner each of said rectangular waves rises at a desired rising timing based on a desired waveform and falls at a desired falling timing based on a desired waveform.

26. A semiconductor device as claimed in claim 24 or 25, further comprising a filter operable to remove a predetermined frequency component from said synthesized wave.

27. A waveform generation method for generating a desired waveform, comprising the steps of:

generating a plurality of rectangular waves;

synthesizing said plurality of rectangular waves to generate a multi-level synthesized wave; and generating said desired waveform based on said synthesized wave.

28. A waveform generation method as claimed in claim 27, wherein said step of generating said plurality of rectangular waves includes the step of generating said plurality of rectangular waves in such a manner that each of said rectangular waves rises at a desired rising timing based on said desired waveform and falls at a desired falling timing based on said desired waveform.

29. A waveform generation method as claimed in claim 27 or 28, wherein said step of generating said multi-level synthesized wave includes the step of calculating voltage values of said plurality of rectangular waves to generate said multi-level synthesized wave.

30. A waveform generation method as claimed in claim 27, further comprising the step of removing a predetermined frequency component of said synthesized wave after said step of generating said multi-level synthesized wave.

* * * * *